United States Patent
Bao et al.

(10) Patent No.: US 9,899,264 B2
(45) Date of Patent: Feb. 20, 2018

(54) INTEGRATED METAL GATE CMOS DEVICES

(71) Applicant: INTERNATIONAL BUSINESS MACHINES CORPORATION, Armonk, NY (US)

(72) Inventors: Ruqiang Bao, Niskayuna, NY (US); Dechao Guo, Niskayuna, NY (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/198,730

(22) Filed: Jun. 30, 2016

(65) Prior Publication Data

US 2018/0005891 A1   Jan. 4, 2018

(51) Int. Cl.
| | |
|---|---|
| H01L 21/82 | (2006.01) |
| H01L 27/08 | (2006.01) |
| H01L 21/8234 | (2006.01) |
| H01L 27/088 | (2006.01) |
| H01L 29/49 | (2006.01) |

(52) U.S. Cl.
CPC .......... *H01L 21/82345* (2013.01); *H01L 21/823487* (2013.01); *H01L 27/0886* (2013.01); *H01L 29/4966* (2013.01)

(58) Field of Classification Search
CPC combination set(s) only.
See application file for complete search history.

(56) References Cited

U.S. PATENT DOCUMENTS

| | | | |
|---|---|---|---|
| 7,855,105 B1 | 12/2010 | Jagannathan et al. | |
| 7,858,459 B2 | 12/2010 | Ramin et al. | |
| 8,212,322 B2 | 7/2012 | Frank et al. | |
| 8,236,686 B2 | 8/2012 | Lee et al. | |
| 8,404,530 B2 | 4/2013 | Ando et al. | |
| 8,420,473 B2 | 4/2013 | Ando et al. | |
| 8,450,169 B2 | 5/2013 | Kwon et al. | |
| 9,012,319 B1 | 4/2015 | Choi et al. | |
| 9,190,488 B1 | 11/2015 | Park et al. | |
| 2011/0147831 A1 | 6/2011 | Steigerwald et al. | |
| 2014/0070300 A1* | 3/2014 | Jang .................. | H01L 27/11565 257/324 |
| 2016/0079239 A1* | 3/2016 | Wang ................ | H01L 21/82348 257/328 |
| 2016/0260716 A1* | 9/2016 | Lee .................... | H01L 29/0649 |
| 2016/0365347 A1* | 12/2016 | Bao .................... | H01L 27/0924 |
| 2017/0148683 A1* | 5/2017 | Balakrishnan .... | H01L 21/82381 |

* cited by examiner

*Primary Examiner* — Mamadou Diallo
(74) *Attorney, Agent, or Firm* — Cantor Colburn LLP; Vazken Alexanian

(57) ABSTRACT

A semiconductor device comprises a first semiconductor fin arranged on a substrate, the first semiconductor fin having a first channel region, and a second semiconductor fin arranged on the substrate, the second semiconductor fin having a second channel region. A first gate stack is arranged on the first channel region. The first gate stack comprises a first metal layer arranged on the first channel region, a work function metal layer arranged on the first metal layer, and a work function metal arranged on the work function metal layer. A second gate stack is arranged on the second channel region, the second gate stack comprising a work function metal arranged on the second channel region.

11 Claims, 47 Drawing Sheets

INTEGRATED METAL GATE CMOS DEVICES

BACKGROUND

The present invention generally relates to complimentary metal-oxide semiconductors (CMOS) and metal-oxide-semiconductor field-effect transistors (MOSFET), and more specifically, to gate stack fabrication.

The MOSFET is a transistor used for switching electronic signals. The MOSFET has a source, a drain, and gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

As CMOS scales to smaller dimensions, nanowire devices provide advantages. A nanowire is often suspended above the substrate by source/drain regions or the gate stack. Because the nanowire is suspended, the channel region of a nanowire device has 360 degrees of exposed area. The gate stack can be formed around the channel region of the nanowire to form a gate-all-around-device. The nanowire can provide even more surface area and greater channel length than a finFET device or planar FET device in a given region of a substrate. Nanowire FETs can be formed from stacked nanowires providing even greater layout density. Stacked nanowires provide, for example, increased drive current within a given layout area.

With the transistors scaling, the threshold voltage for different devices via the channel doping becomes more and more difficult for finFET devices, nanosheet devices and nanowire devices due to complex device structure as well as due to the maximum available Vt tuned by channel doping. Therefore, threshold voltage tuned by pure work function is needed to offer the different Vt type devices. In addition, due to the impurity scattering in the channel because of the need to have the channel doping to change the threshold voltage, the mobility of the transistors will be degraded and thus the performance will be impacted by channel doping to change the Vts. However, threshold voltage tuned by work function has no such issue because no channel doping is needed. And thus, threshold voltage tune by work function metal in the gate can offer different Vts but without performance degradation. Therefore, threshold voltage tune by work function metal in the gate become quite critical to have high performance chip.

Gate spacers form an insulating film along gate sidewalls. Gate spacers can also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming semiconductor devices, comprises forming a first channel region, a second channel region, a third channel region, and a fourth channel region on a substrate, forming a first metal layer on the first channel region, the second channel region, the third channel region, and the fourth channel region, and forming a sacrificial block layer on the first metal layer and forming a sacrificial patterning layer on the sacrificial block layer. The first metal layer, the sacrificial block layer and the sacrificial patterning layer are removed from the first channel region. A barrier metal layer is formed on the first channel region and over the sacrificial patterning layer. The first metal layer, the sacrificial block layer, the sacrificial patterning layer, and the barrier metal layer are removed from the second channel region and third channel region. The first metal layer is removed from the second channel region and the third channel region, and the barrier metal layer, the sacrificial patterning layer are removed from the fourth channel region. The sacrificial block layer is removed from the fourth channel region. A third metal layer and a work function metal layer are deposited on the first channel region, the second channel region, the third channel region, and the fourth channel region. The third metal layer and the work function metal layer from the third channel region. A work function metal is deposited on the first channel region, the second channel region, the third channel region, and the fourth channel region.

According to another embodiment of the present invention, a semiconductor device comprises a first semiconductor fin arranged on a substrate, the first semiconductor fin having a first channel region, and a second semiconductor fin arranged on the substrate, the second semiconductor fin having a second channel region. A first gate stack is arranged on the first channel region. The first gate stack comprises a first metal layer arranged on the first channel region, a work function metal layer arranged on the first metal layer, and a work function metal arranged on the work function metal layer. A second gate stack is arranged on the second channel region, the second gate stack comprising a work function metal arranged on the second channel region.

According to yet another embodiment of the present invention, a semiconductor device comprises a first semiconductor fin arranged on a substrate, the first semiconductor fin having a first channel region, and a second semiconductor fin arranged on the substrate, the second semiconductor fin having a second channel region. A first gate stack is arranged on the first channel region, the first gate stack includes a barrier metal layer arranged on the first channel region, a first metal layer arranged on the barrier metal layer, a work function metal layer arranged on the first metal layer, and a work function metal arranged on the work function metal layer. A second gate stack is arranged on the second channel region, the second gate stack includes a first metal layer arranged on the second channel region, a sacrificial patterning layer arranged on the first metal layer, a work function metal layer arranged on the sacrificial patterning layer, and another work function metal arranged on the work function metal layer.

BRIEF DESCRIPTION OF THE DRAWINGS

FIGS. 1-20B illustrate an exemplary method for forming four different types of gate stacks on a single wafer or substrate.

FIG. 1 illustrates a side view of a semiconductor-on-insulator (SOI) wafer.

FIG. 3 illustrates a top view following the formation of sacrificial gates over channel regions of the fins.

FIG. 4 illustrates a top view following the formation of spacers adjacent to the sacrificial gates.

FIG. 5 illustrates a top view following the formation of source/drain regions.

FIG. 6 illustrates a top view following the formation of an inter-level dielectric layer over the source/drain regions 502 (of FIG. 5).

FIG. 20A and FIG. 20B illustrate cut-away views following a planarization process.

FIG. 21 illustrates a cut-away view following the removal of the sacrificial gates (as shown in FIGS. 7A and 7B) to form the cavities.

FIG. 22 illustrates a cut-away view following the patterning of a mask over the channel region and the removal of the exposed metal capping barrier layer.

FIG. 23 illustrates a cut-away view following the removal of the mask and the top patterning layer.

FIG. 24 illustrates a cut-away view following the deposition of a metal barrier layer/a metal capping layer over the channel regions.

FIG. 25 illustrates a cut-away view following the deposition of an insulator layer.

FIG. 26 illustrates a cut-away view following an annealing process that forms of a metal capping layer region in the channel region. The metal capping layer should be between interfacial layer and the high dielectric constant material (high K) after annealing.

FIG. 27 illustrates a cut-away view following the removal of the insulator layer, of a metal barrier layer/a metal capping layer, and the metal barrier layer in the cavities.

DETAILED DESCRIPTION

Threshold voltage is the minimum voltage differential between the source region and gate that instigates a conductive path between the source and drain regions of a FET device. The threshold voltage of a FET device can be partially set by the type and the arrangement of the materials in the gate stack of the device.

The methods and embodiments described herein provide for forming semiconductor devices having different gate stacks on a single substrate such that the resultant devices have different threshold voltages.

FIGS. 1-20B illustrate an exemplary method for forming four different types of gate stacks on a single wafer or substrate.

Figure 1:
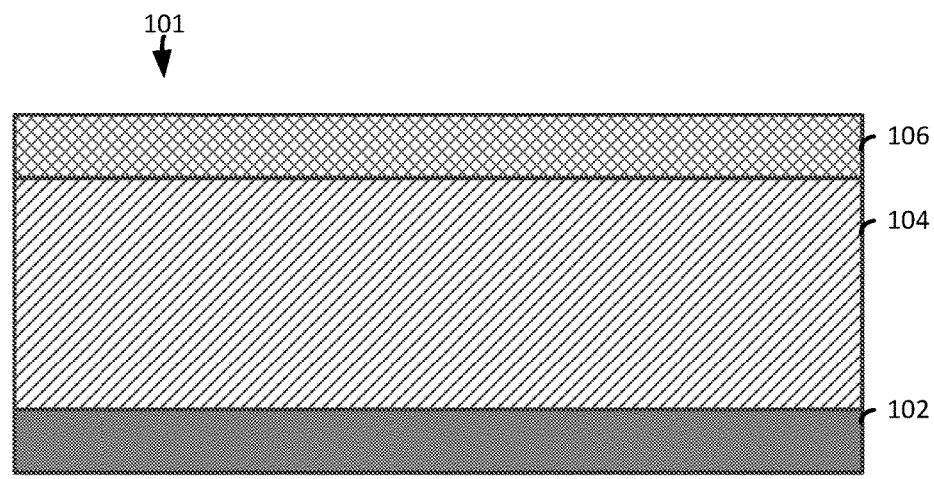

FIG. 1 illustrates a side view of a semiconductor-on-insulator (SOI) wafer 101. The SOI wafer 101 includes an insulator layer 102 and a semiconductor substrate 104 arranged on the insulator layer 102. The SOI wafer 101 can be formed by any suitable technique such as, for example wafer bonding, Smartcut™, SIMOX (Separation by IMplanted Oxygen).

The semiconductor substrate 104 can include, for example, silicon, germanium, silicon germanium, silicon carbide, and those consisting essentially of III-V compound semiconductors having a composition defined by the formula AlX1GaX2InX3AsY1PY2NY3SbY4, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition ZnA1CdA2SeB1TeB2, where A1, A2, B1, and B2 are relative proportions each greater than or equal to zero and A1+A2+B1+B2=1 (1 being a total mole quantity). The semiconductor substrate can also comprise an organic semiconductor or a layered semiconductor such as, for example, Si/SiGe, a silicon-on-insulator or a SiGe-on-insulator. A portion or entire semiconductor substrate can be amorphous, polycrystalline, or monocrystalline. In addition to the aforementioned types of semiconductor substrates, the semiconductor substrate employed in the present invention can also comprise a hybrid oriented (HOT) semiconductor substrate in which the HOT substrate has surface regions of different crystallographic orientation. The semiconductor substrate can be doped, undoped or contain doped regions and undoped regions therein. The semiconductor substrate can contain regions with strain and regions without strain therein, or contain regions of tensile strain and compressive strain.

The insulator layer 102 can include, for example, a buried oxide (BOX) material or other suitable insulator materials. Examples of suitable insulator materials include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum.

The thickness of insulator layer 102 generally varies and is not intended to be limited. In one aspect, the thickness of the insulator layer 102 is in a range from about 10 nm to about 1000 nm. The insulator layer 102 can be formed by any suitable process such as thermal oxidation, thermal nitridation, chemical vapor deposition (CVD).

A hardmask layer 106 is arranged on the semiconductor substrate 104. The hardmask 106 can include, for example, silicon oxide, silicon nitride (SiN), SiOCN, SiBCN or any suitable combination of those. The hardmask 106 can be deposited using a deposition process, including, but not limited to, PVD, CVD, PECVD, or any combination thereof.

Though the illustrated exemplary embodiment includes a semiconductor-on-insulator wafer 101, alternate exemplary embodiments can be formed on a bulk semiconductor substrate. With a bulk substrate, an additional shallow trench insulator can be formed on the substrate and between the fins 202.

Figure 2A:
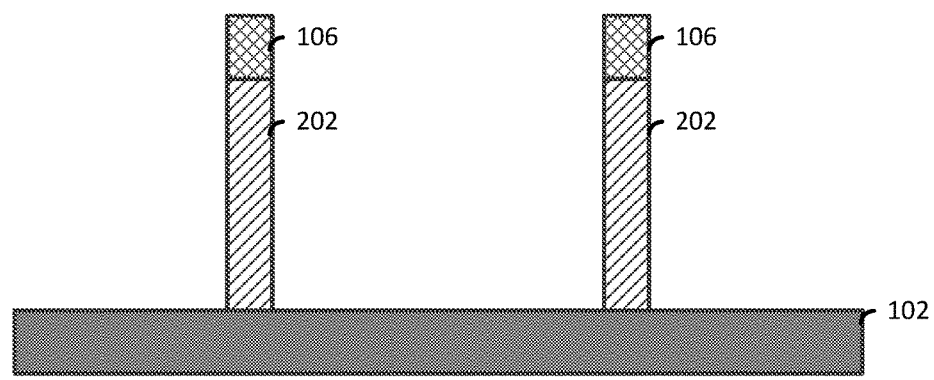
FIG. 2A illustrates a side view following the formation of fins on the insulator layer.
Figure 2B:
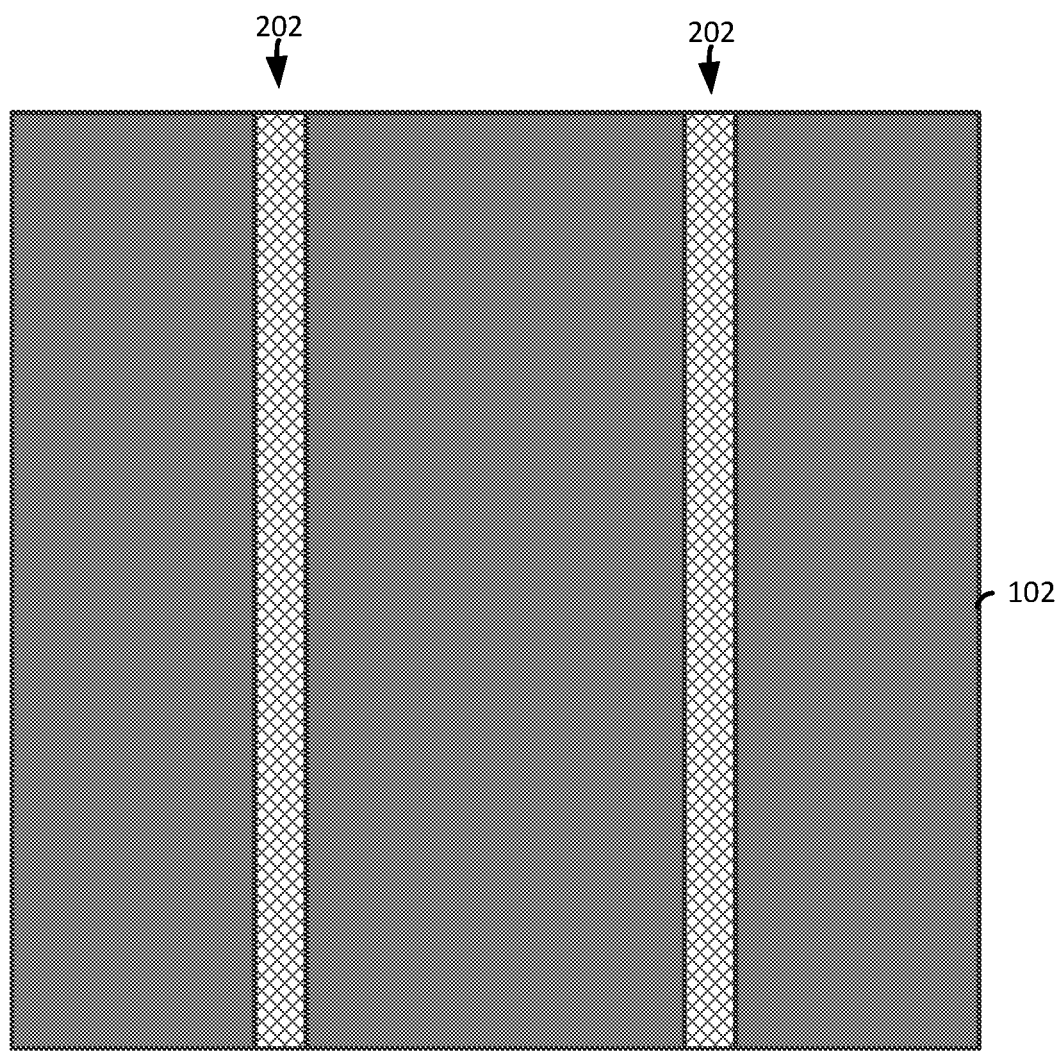
FIG. 2B illustrates a top view of the fins on the insulator layer.

FIG. 2A illustrates a side view following the formation of fins 202 on the insulator layer 102. The fins 202 can be patterned by, for example, a lithographic patterning and etching process such as, reactive ion etching (RIE) or a sidewall imaging transfer process that removes exposed portions of the hardmask 106 and portions of the semiconductor substrate 104 to expose portions of the insulator layer 102. FIG. 2B illustrates a top view of the fins 202 on the insulator layer 102.

Figure 3:
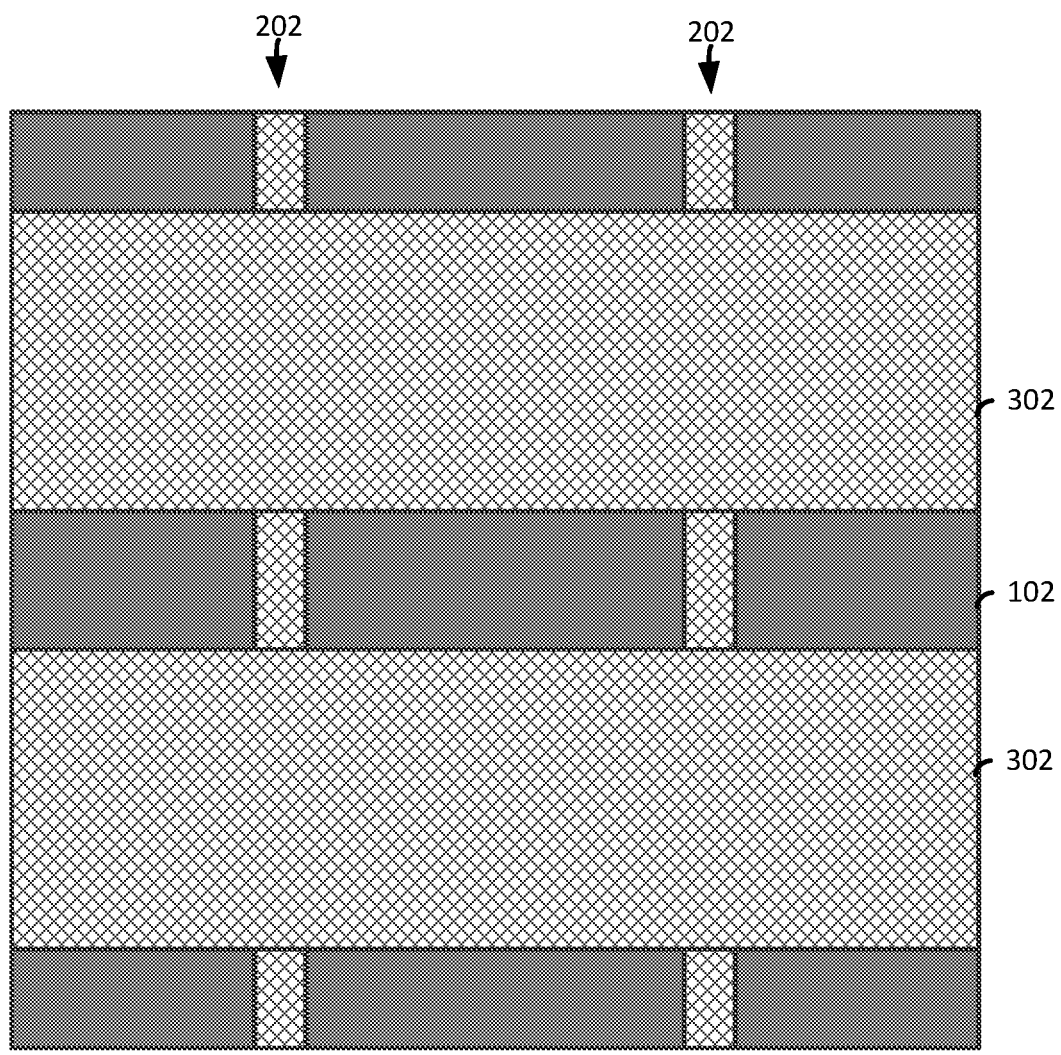

FIG. 3 illustrates a top view following the formation of sacrificial gates 302 over channel regions of the fins 202.

The sacrificial gates 302 in the exemplary embodiment are formed by depositing a layer (not shown) of sacrificial gate material such as, for example, amorphous silicon (aSi), or polycrystalline silicon (polysilicon) material or another suitable sacrificial gate material like W. The sacrificial gate 302 can further comprises a sacrificial gate dielectric material such as silicon oxide between the nanowires and aSi or polysilicon material.

The layer sacrificial gate material can be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap (not shown). The hardmask layer can be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gates 302 and the sacrificial gate caps.

Figure 4:
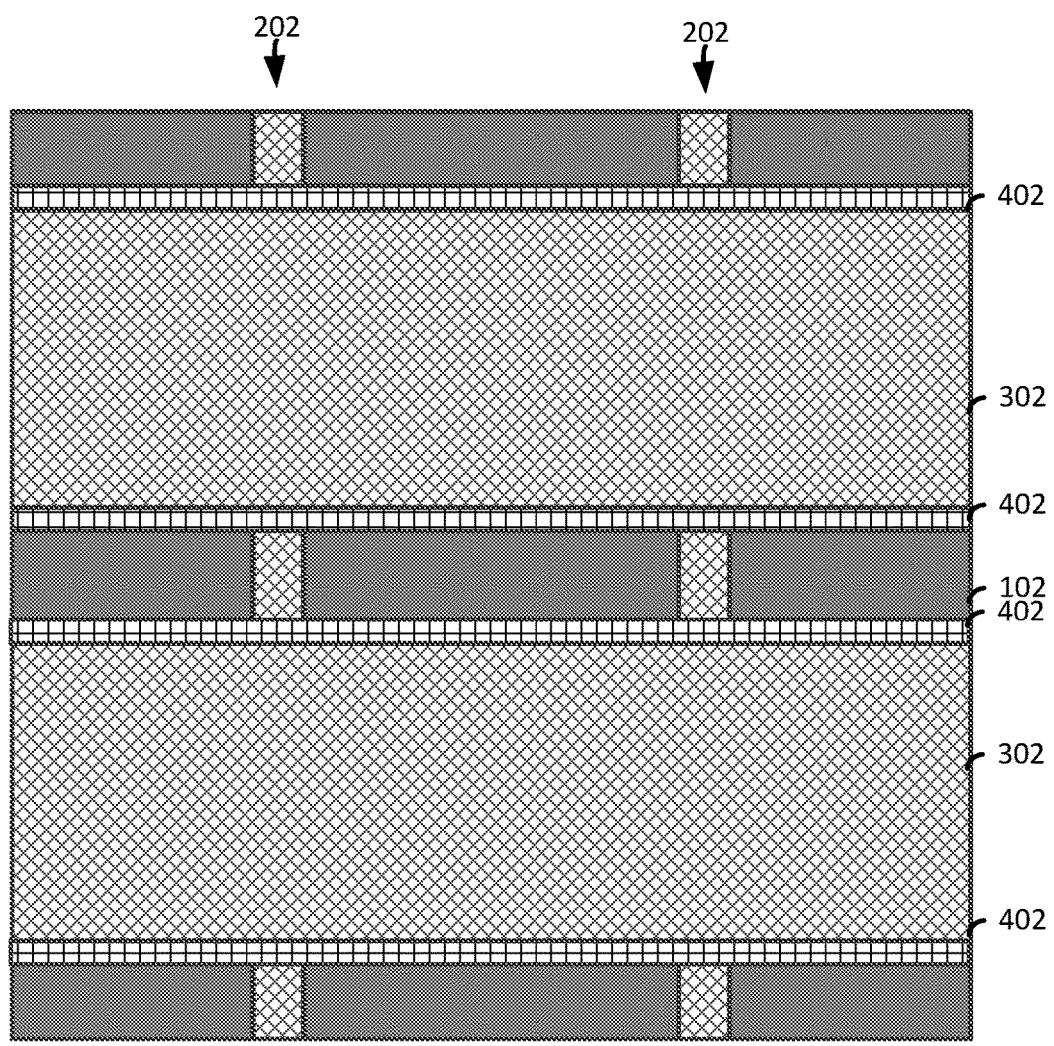

FIG. 4 illustrates a top view following the formation of spacers 402 adjacent to the sacrificial gates 302. The spacers 402 in the illustrated embodiment are formed by depositing a layer of spacer material (not shown) over the exposed portions of the insulator layer 102, the fins 202, and the sacrificial gates 302. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material on any flat regions to form the spacers 402.

Figure 5:
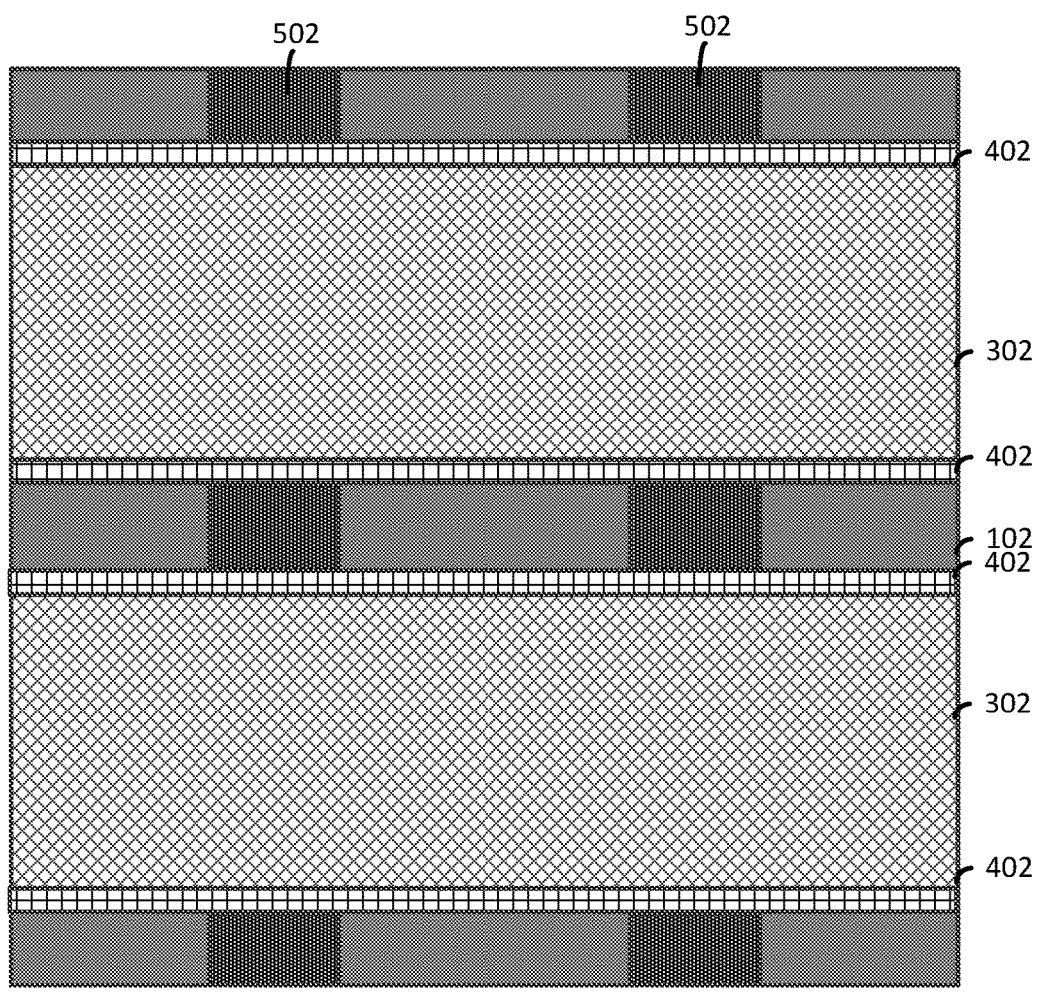

FIG. 5 illustrates a top view following the formation of source/drain regions 502. The source/drain regions 502 are formed by an epitaxial growth process that deposits a crystalline overlayer of semiconductor material onto the exposed crystalline seed material of the exposed fin 202 to form the source/drain regions 502.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ to $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 6:
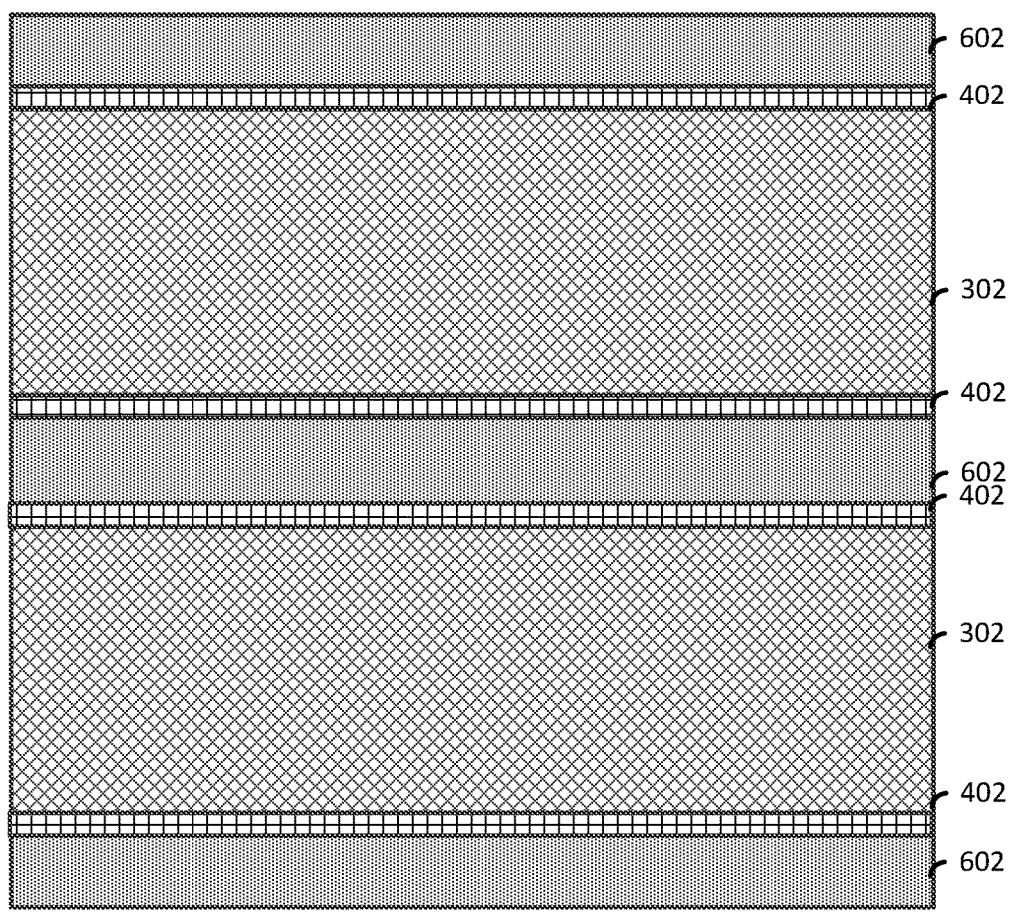

FIG. 6 illustrates a top view following the formation of an inter-level dielectric layer 602 over the source/drain regions 502 (of FIG. 5). The inter-level dielectric layer 602 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 602 is deposited by a deposition process, including, but not limited to CVD, PVD, plasma enhanced CVD, atomic layer deposition (ALD), evaporation, chemical solution deposition, or like processes. Following the deposition of the inter-level dielectric layer 602, a planarization process such as, for example, chemical mechanical polishing is performed.

Figure 7A:
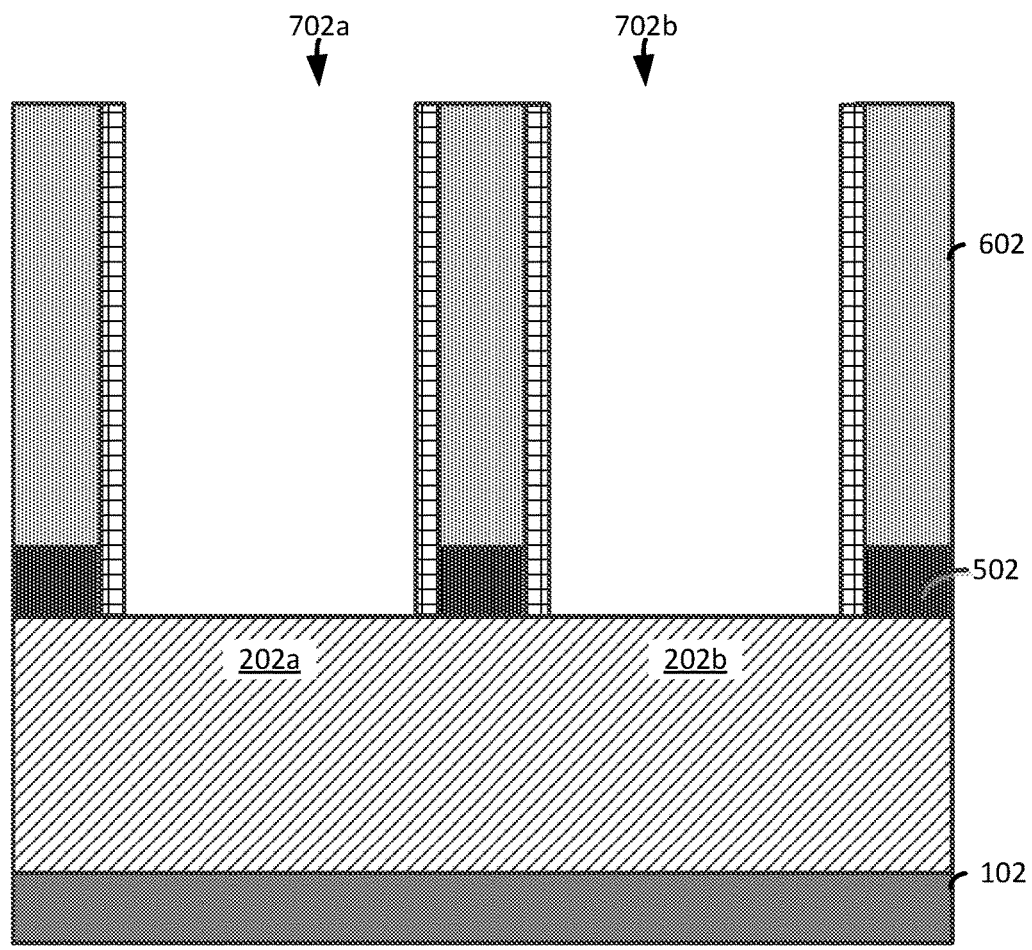
FIG. 7A illustrates a cut-away view along the line A-A (of FIG. 7C).
Figure 7B:
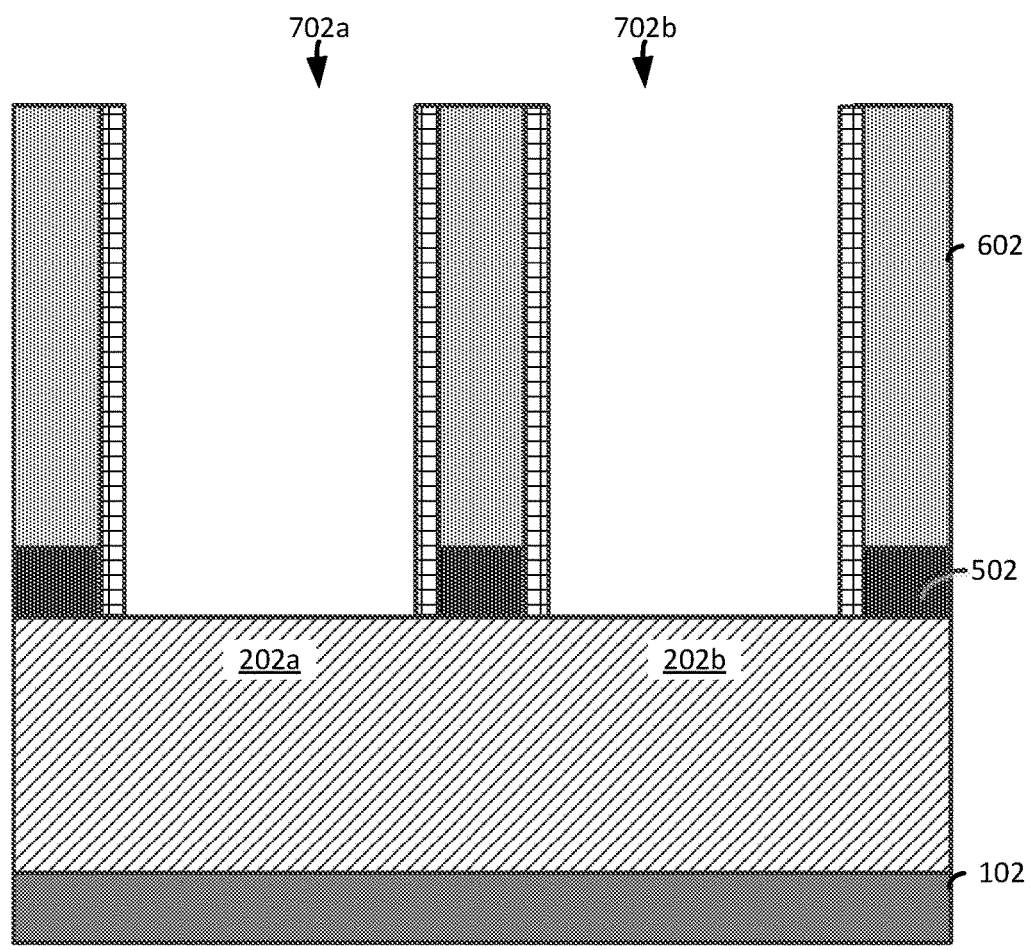
FIG. 7B illustrates a cut-away view along the line B-B (of FIG. 7C) of the resultant structure following the removal of the sacrificial gates (of FIG. 6) to form cavities that expose the channel regions of the fins.
Figure 7C:
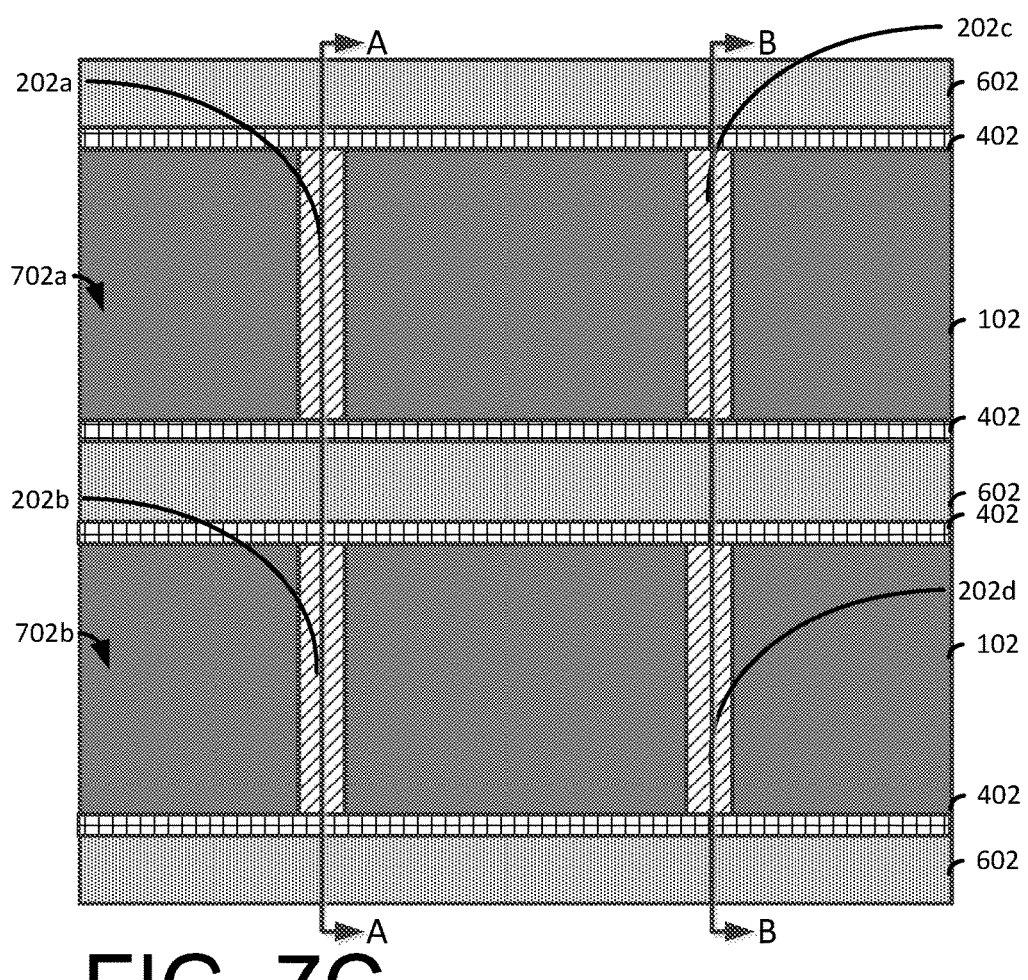
FIG. 7C illustrates a top view of the cavities and the channel regions.

FIG. 7A illustrates a cut-away view along the line A-A (of FIG. 7C) and FIG. 7B illustrates a cut-away view along the line B-B (of FIG. 7C) of the resultant structure following the removal of the sacrificial gates 302 (of FIG. 6) to form cavities 702a and 702b that expose the channel regions of the fins 202. The sacrificial gates 302 can be removed by performing a dry etch process, for example, RIE, followed by a wet etch process. The wet etch process is selective to (will not substantially etch) the spacers 402 and the inter-level dielectric material. The chemical etch process can include, but is not limited to, hot ammonia or tetramethylammonium hydroxide (TMAH). FIG. 7C illustrates a top view of the cavities 702a and 702b and the channel regions 202a, and 202c arranged in the first cavity 702a and the channel regions 202b and 202d arranged in the second cavity 702b.

Following the removal of the sacrificial gates 302, an interfacial layer such as, for example, SiO2 or SiN can be formed conformally over the exposed channel regions of the fins 202. Following the formation of the interfacial layer, a high k dielectric layer is deposited over the interfacial layer. Following the formation of the high k dielectric layer, the first metal layer 802 (described below) can be formed. In an embodiment, the first metal layer 802 is TiN. The first metal layer is from 20 angstrom to 60 angstrom. For clarity, the interfacial layer and the high k dielectric layer will be shown in FIGS. 20A and 20B that are described below.

Figure 8A:
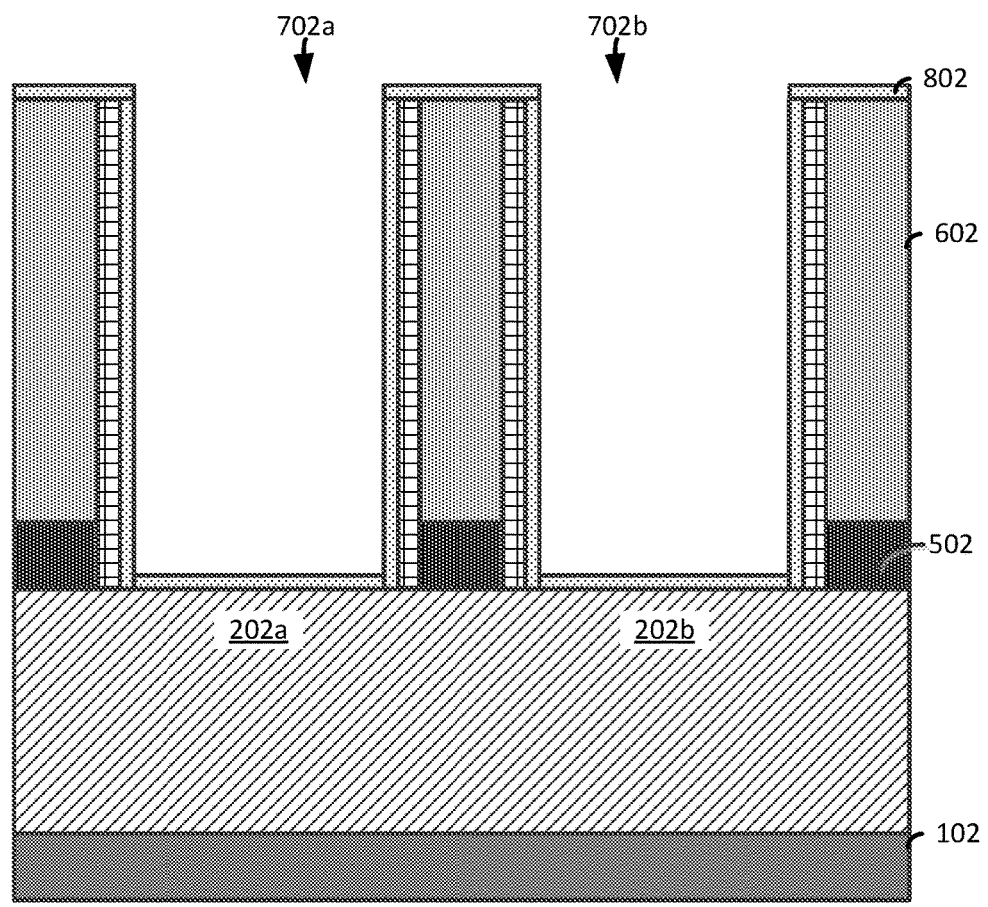
FIG. 8A and FIG. 8B illustrate a cut-away views following the deposition of a first metal layer in the cavities.
Figure 8B:
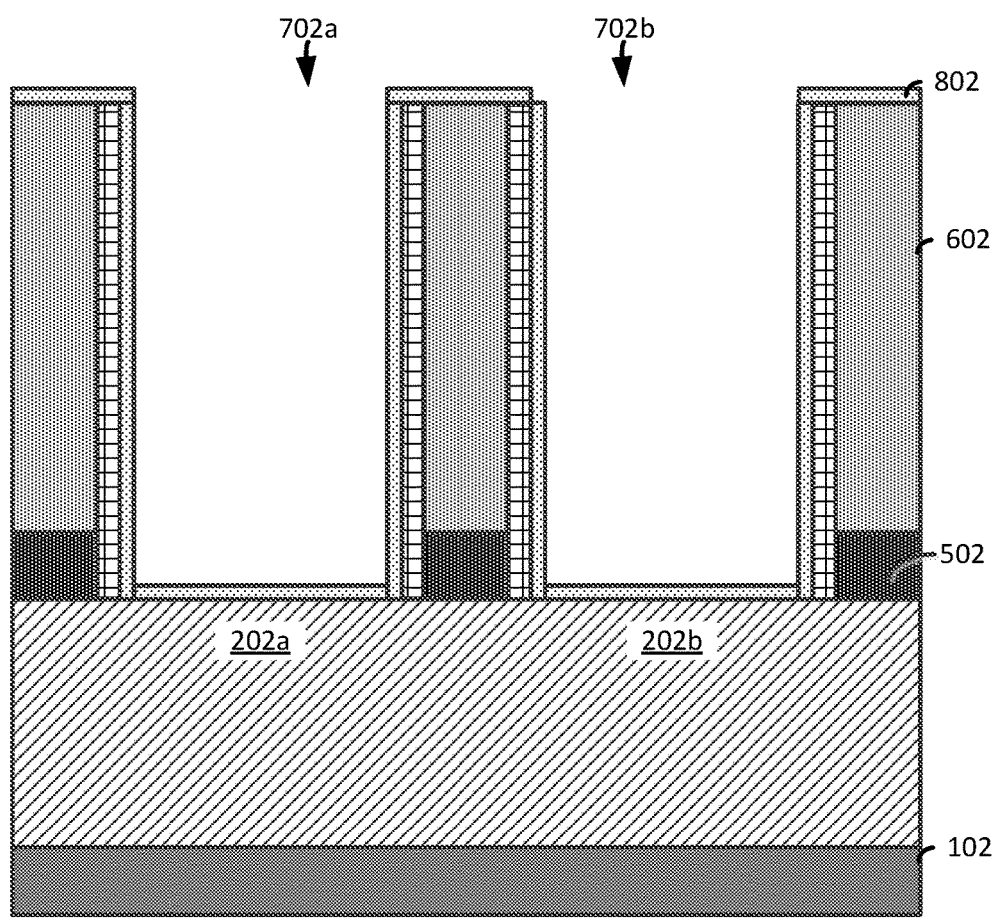

FIG. 8A and FIG. 8B illustrate a cut-away views following the deposition of a first metal layer 802 in the cavities 702a and 702b. In the illustrated exemplary embodiment, the first metal layer 802 has a thickness of about 20 A or less. The first metal layer 802 and other dielectric materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

Figure 9A:
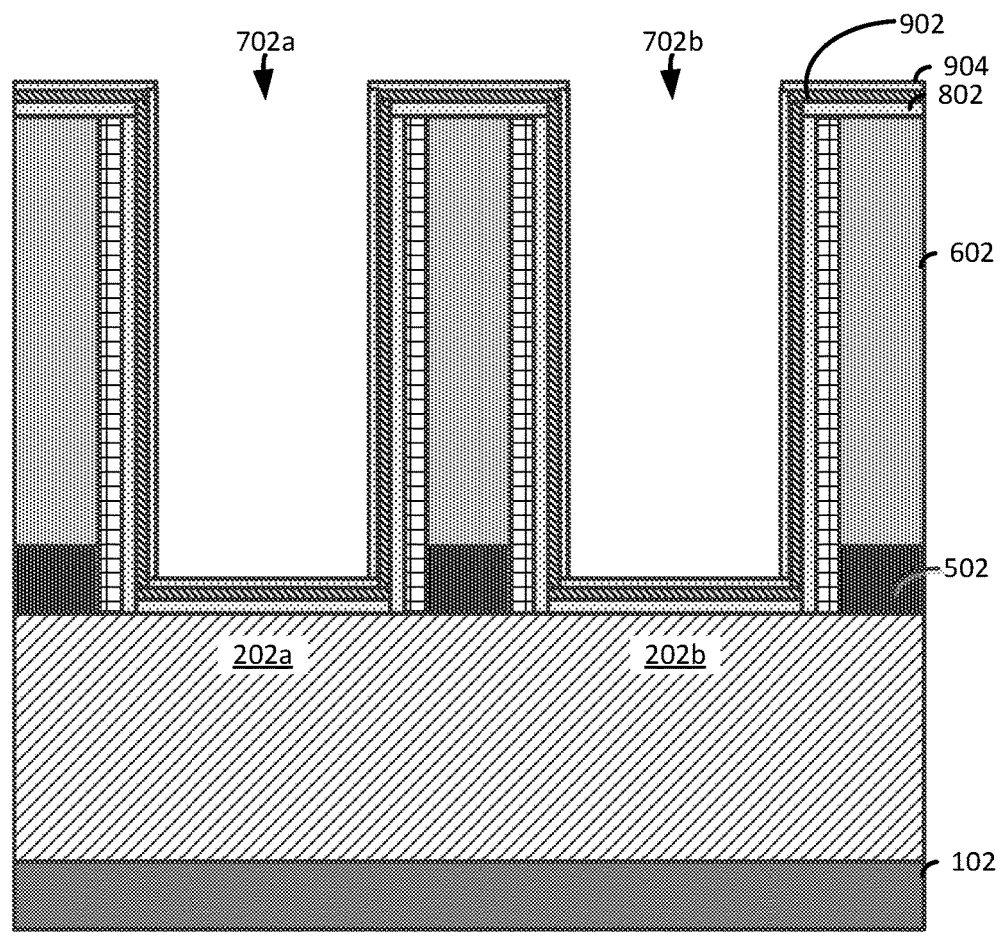
FIG. 9A and FIG. 9B illustrate cut-away views following the deposition of a sacrificial block layer over the first metal layer and the sacrificial patterning layer over the sacrificial block layer.
Figure 9B:
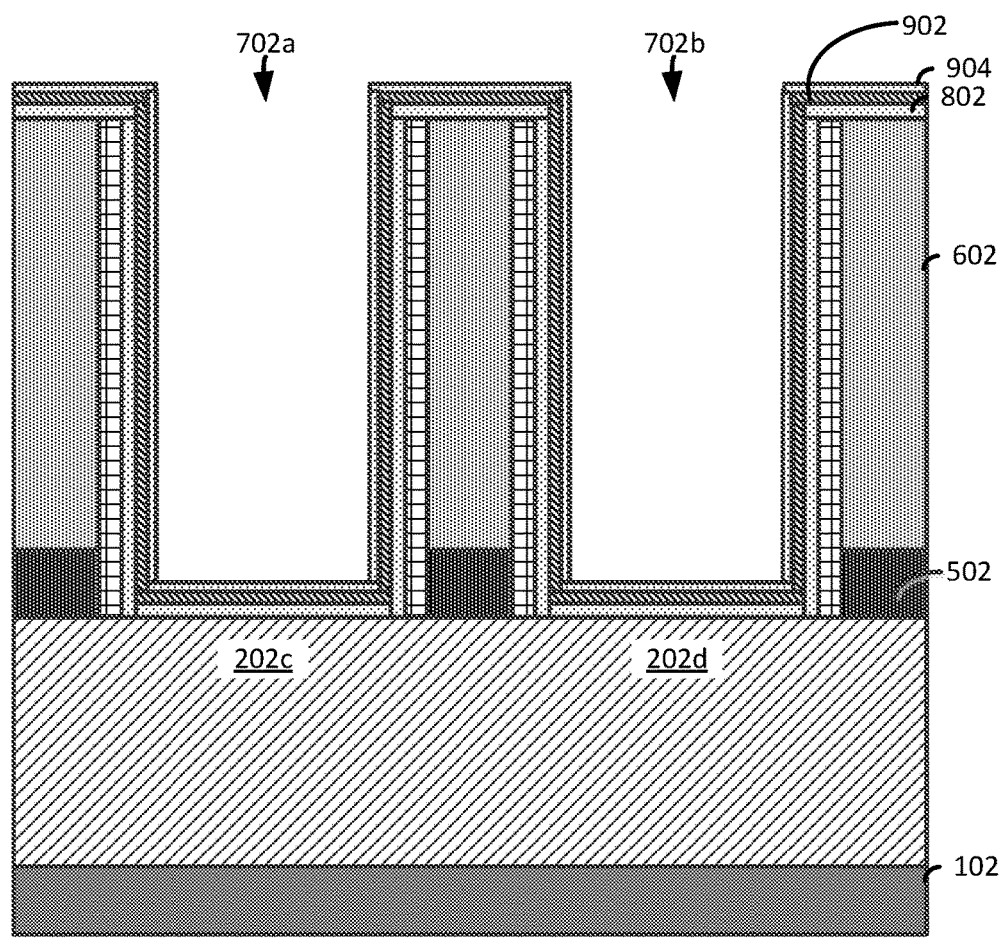

FIG. 9A and FIG. 9B illustrate cut-away views following the deposition of a sacrificial block layer 902 over the first metal layer 802 and a layer of sacrificial patterning layer 904 over the sacrificial block layer 902. The sacrificial patterning layer 904 and the sacrificial block layer 902 could be metal layer or dielectric layer. The individual thickness of these two layers is about 10 A or less.

Figure 10A:
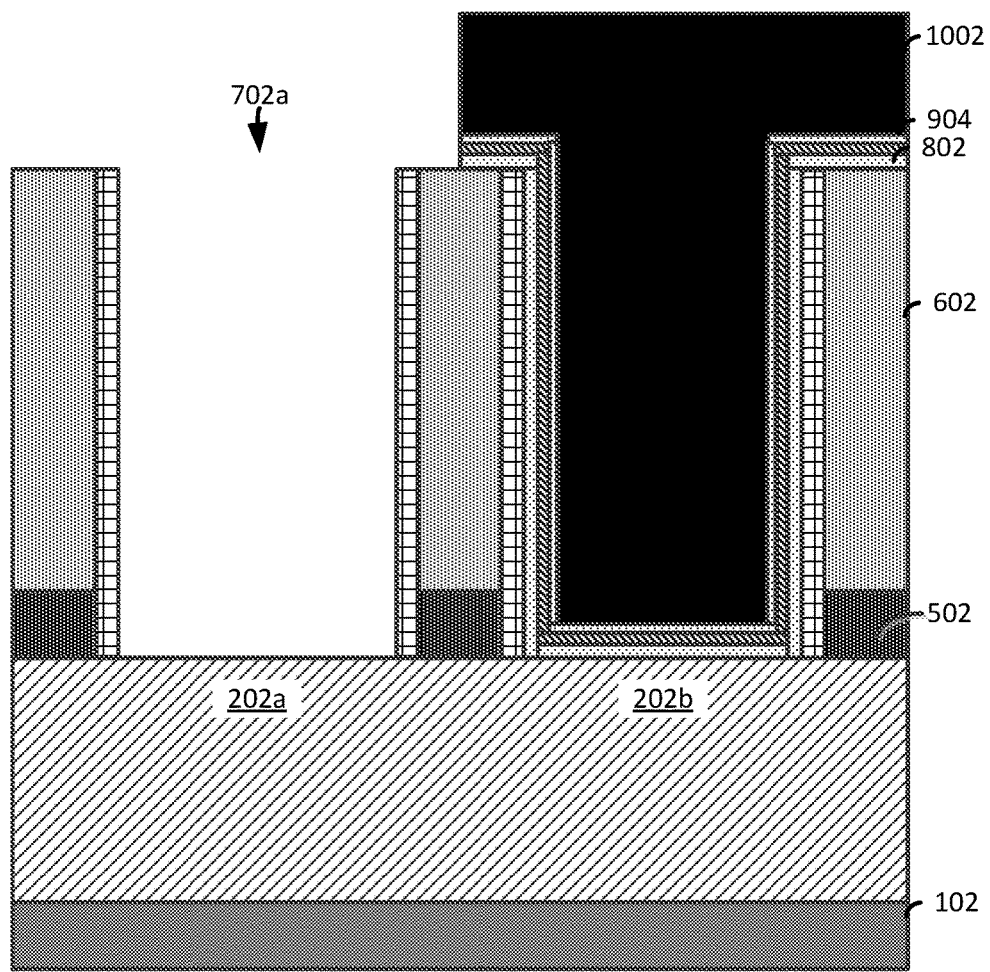
FIG. 10A and FIG. 10B illustrate cut-away views following the patterning of a mask over the channel regions and the removal of the first metal layer, the block sacrificial layer and the sacrificial patterning layer from the channel region.
Figure 10B:
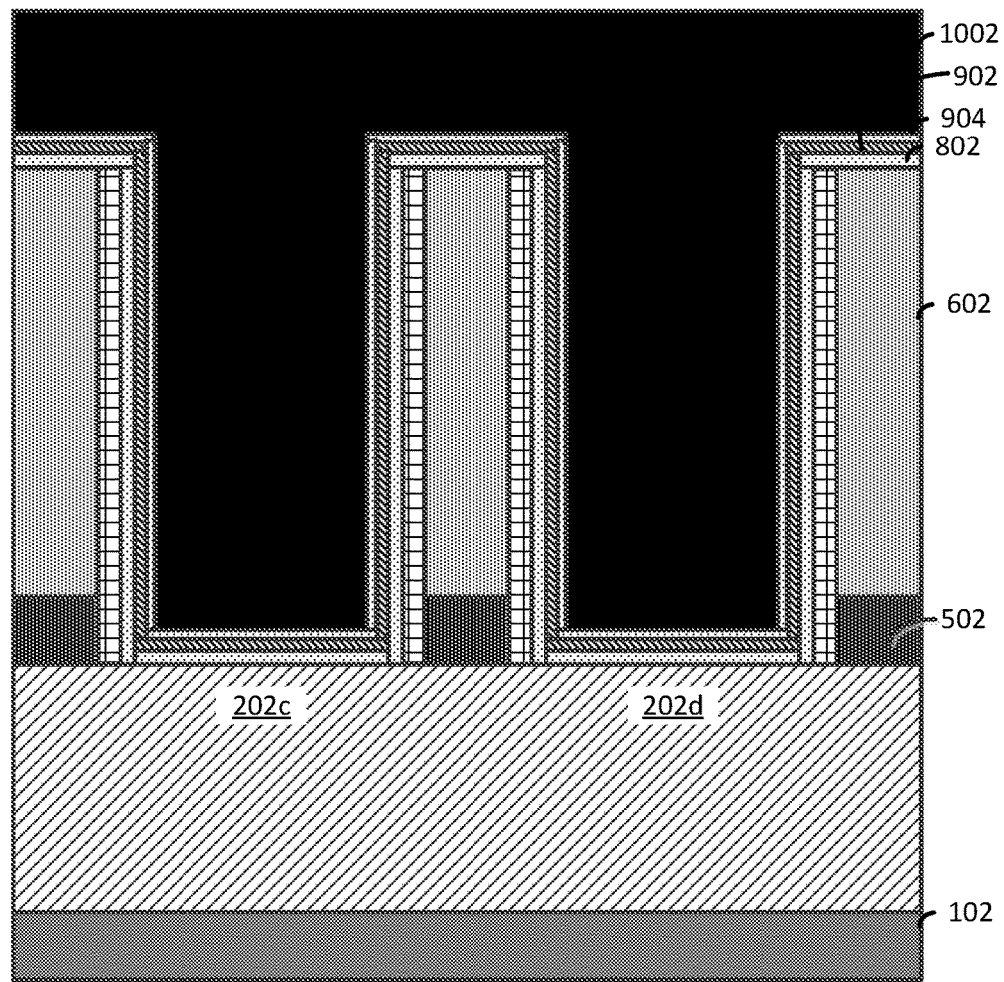

FIG. 10A and FIG. 10B illustrate cut-away views following the patterning of a mask 1002 over the channel regions 202b, 202c, and 202d and the removal of the first metal layer 802, the sacrificial block layer 902 and the sacrificial patterning layer 904 from the channel region 202a. The mask 1002 can include, for example, a resist mask or an organic planarization layer that has been patterned using a resist mask and etching process. The first metal layer 902, the sacrificial block layer 902 and the sacrificial patterning layer 904 can be removed from the channel region 202a, by for example, an etching process such as reactive ion etching.

Figure 11A:
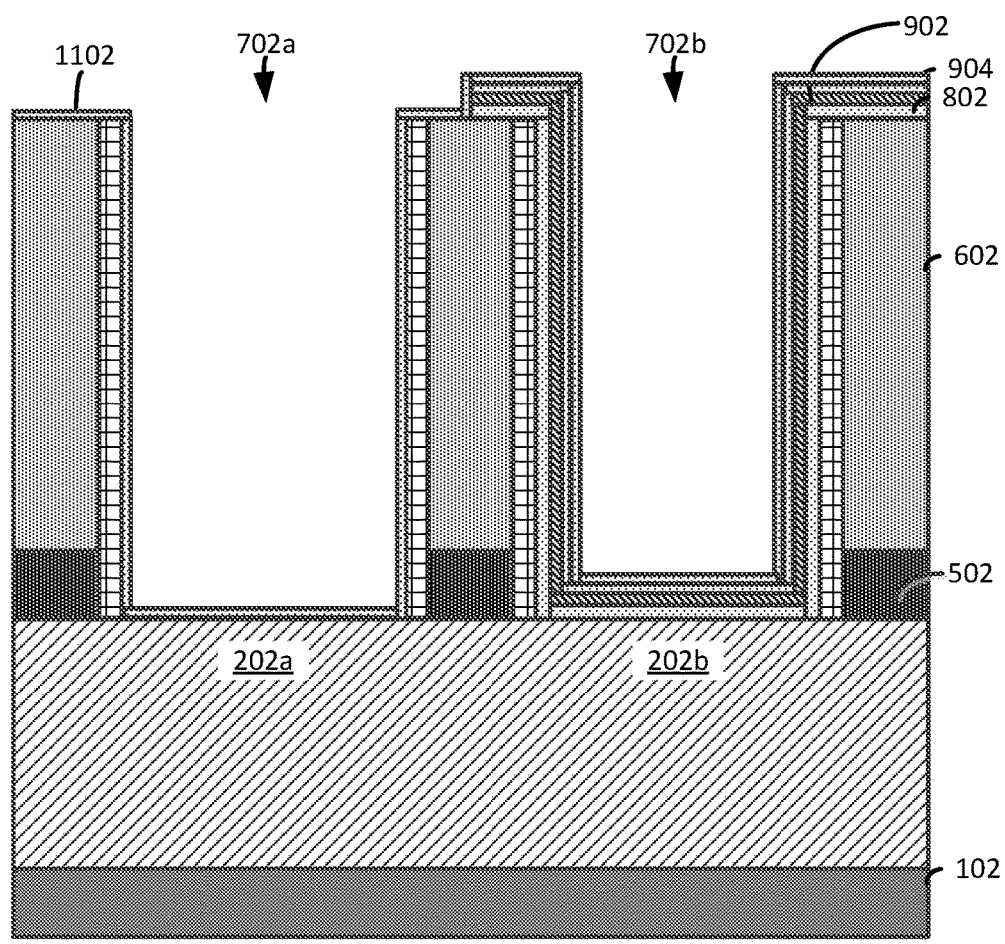
FIG. 11A and FIG. 11B illustrate cut-away views following the deposition of a barrier metal layer in the cavities.
Figure 11B:
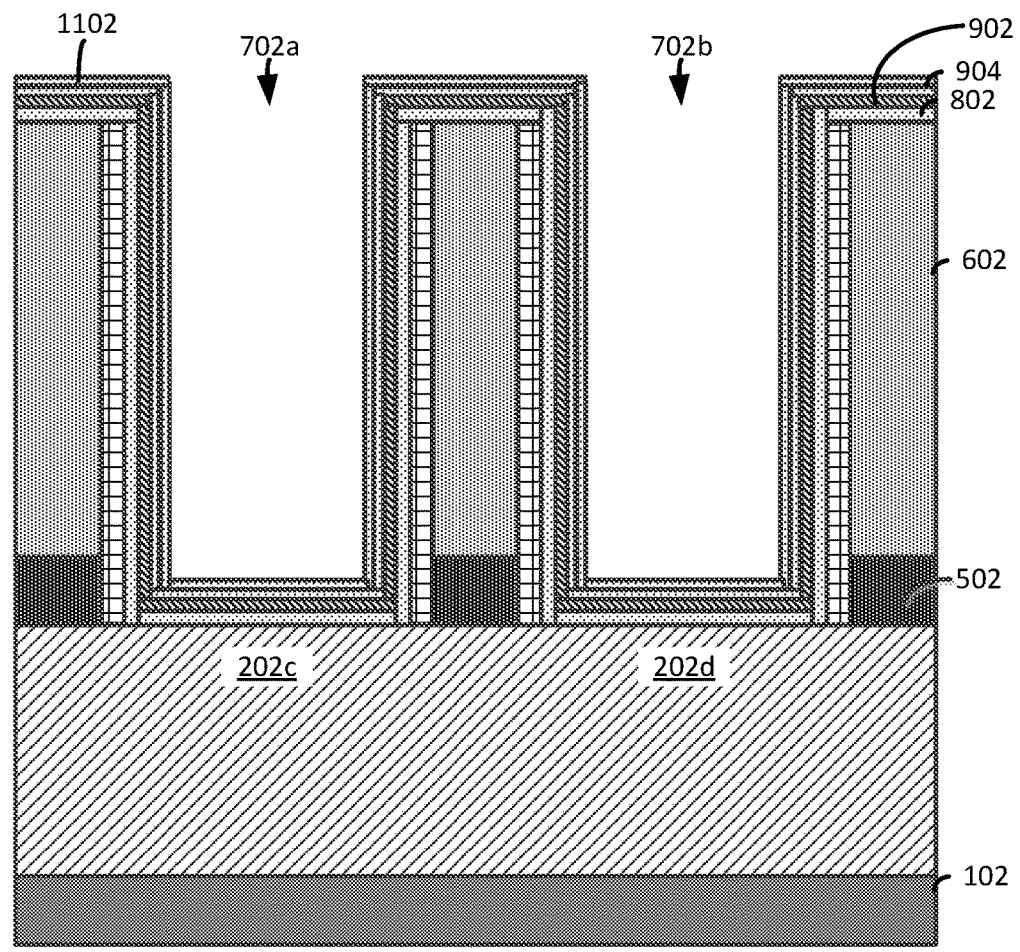

FIG. 11A and FIG. 11B illustrate cut-away views following the deposition of a barrier metal layer 1102 in the cavities 702a and 702b. The mask 1002 (of FIGS. 10A and 10B) can be removed by a suitable process such as, for example, ashing. The ashing process can be used to remove a photoresist material, amorphous carbon, or organic planarization (OPL) layer. Ashing is performed using a suitable reaction gas, for example, O2, N2, H2/N2, O3, CF4, or any combination thereof.

Figure 12A:
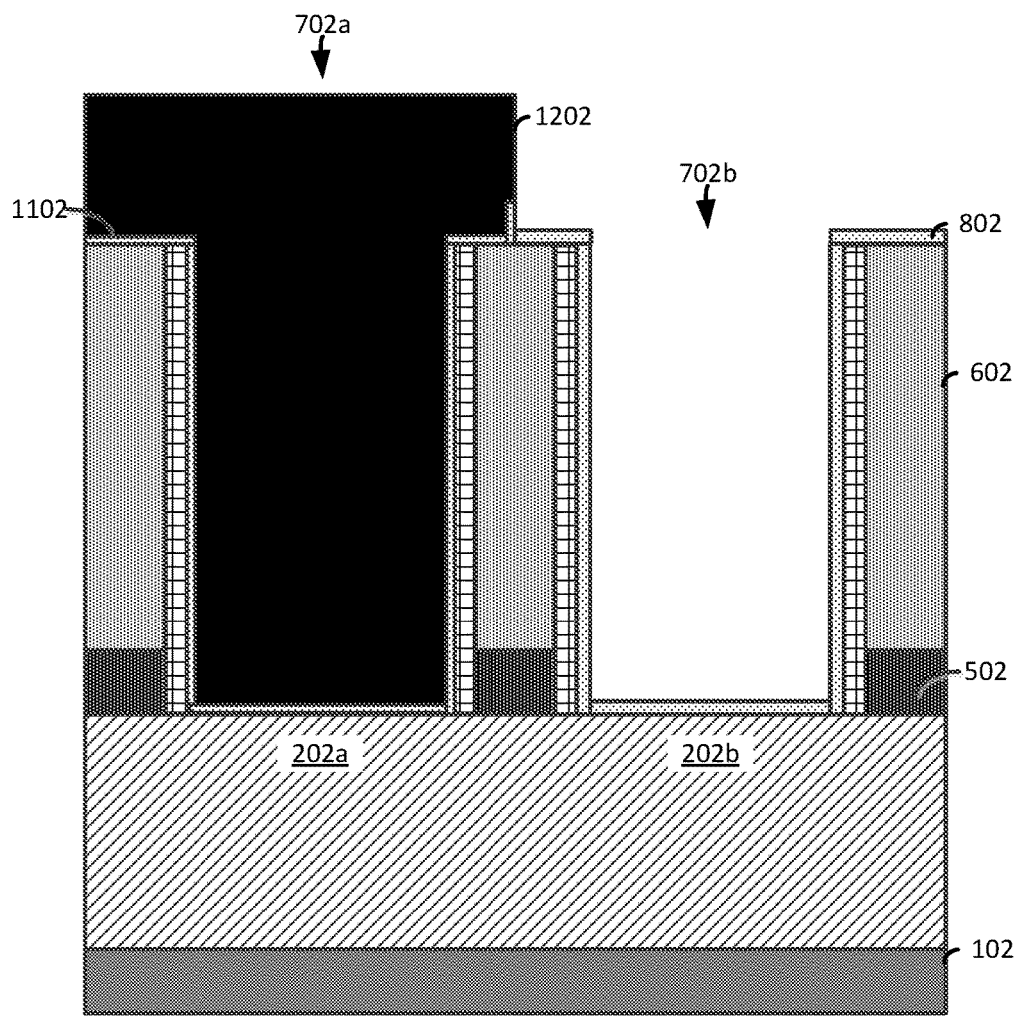
FIG. 12A and FIG. 12B illustrate cut-away views following the patterning of a mask over the channel regions.
Figure 12B:
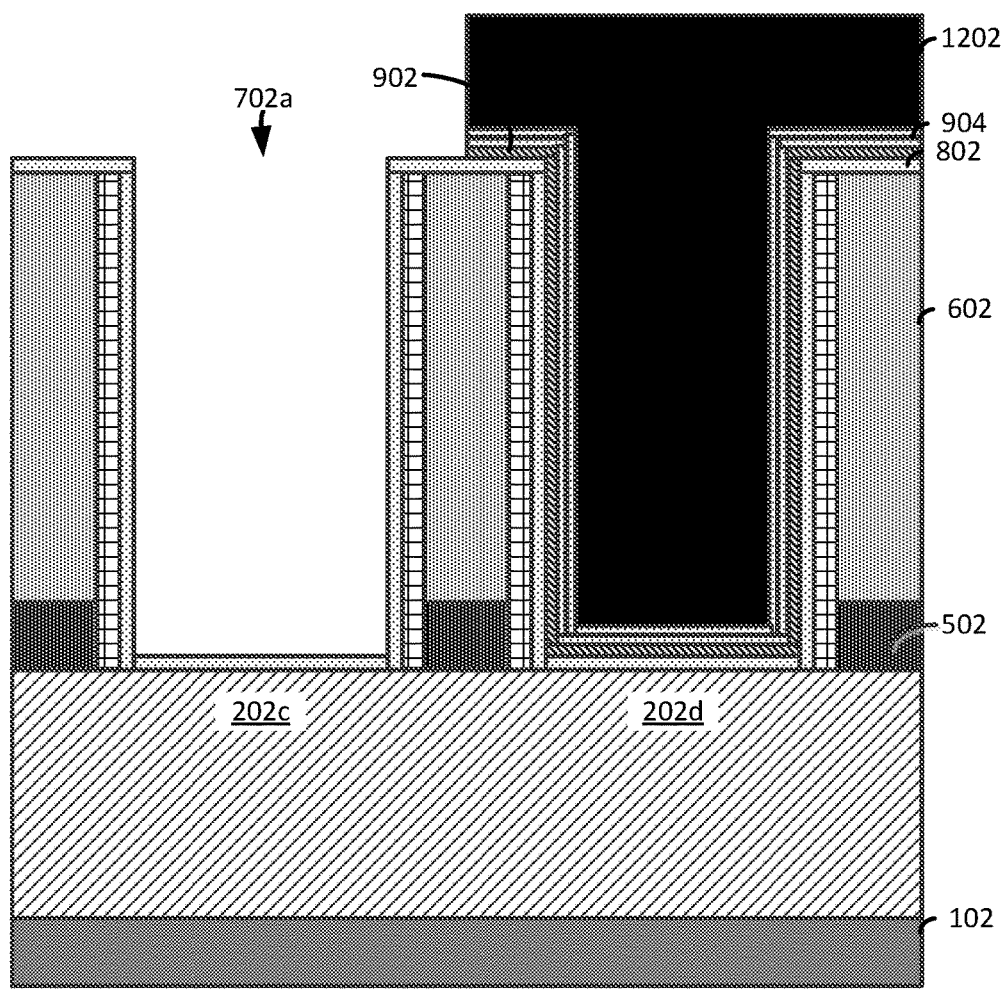

FIG. 12A and FIG. 12B illustrate cut-away views following the patterning of a mask 1202 over the channel regions 202a and 202d. Following the patterning of the mask 1202, an etching process is performed that removes exposed portions of the barrier metal layer 1102, the sacrificial block layer 902 and the sacrificial patterning layer 904 to expose the first metal layer 802 in over the channel regions 202b and 202c. In one embodiment, the barrier metal layer 1102 is TiN. The barrier metal layer 1102 is from 1 angstrom to 25 angstrom.

Figure 13A:
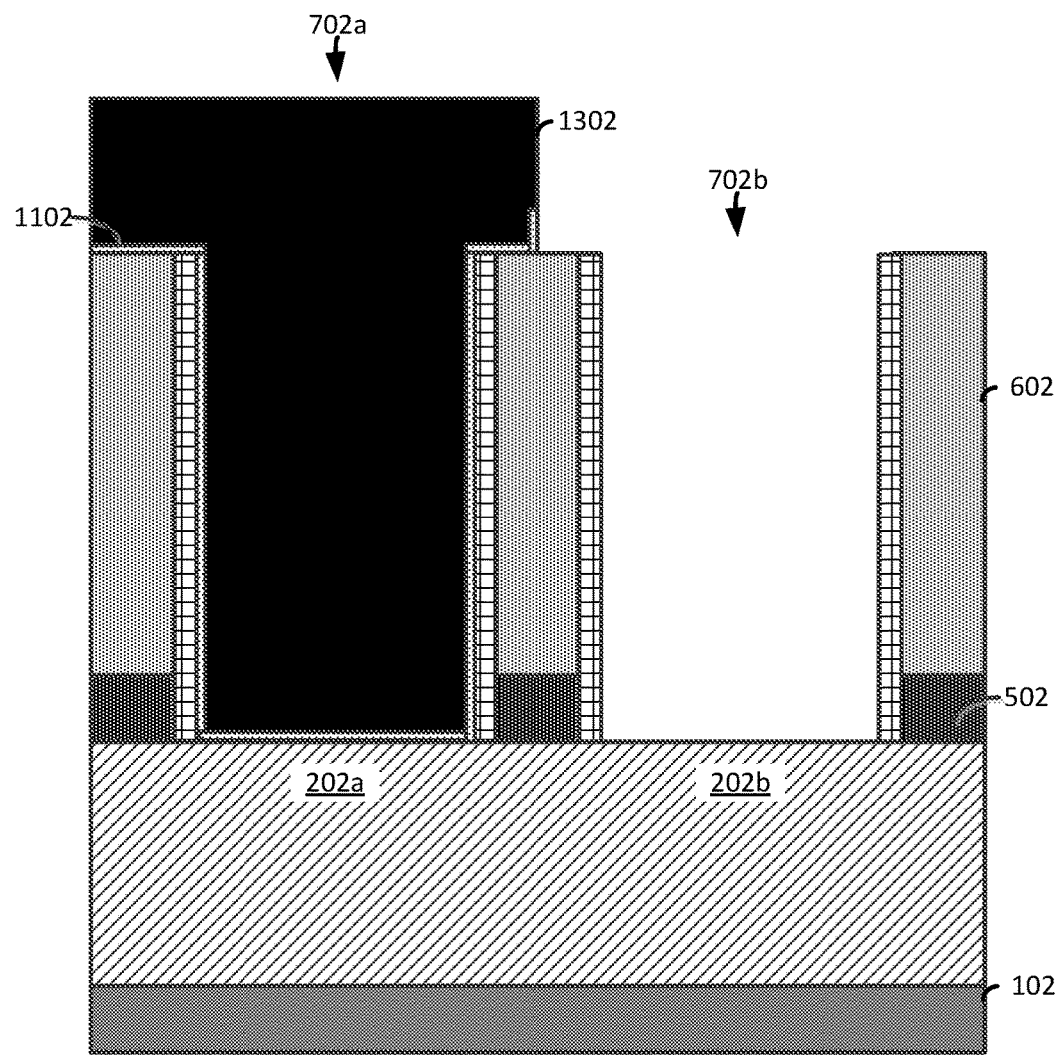
FIG. 13A and FIG. 13B illustrate cut-away views following the removal of the mask (of FIGS. 12A and 12B) and the patterning of the mask over the channel region.
Figure 13B:
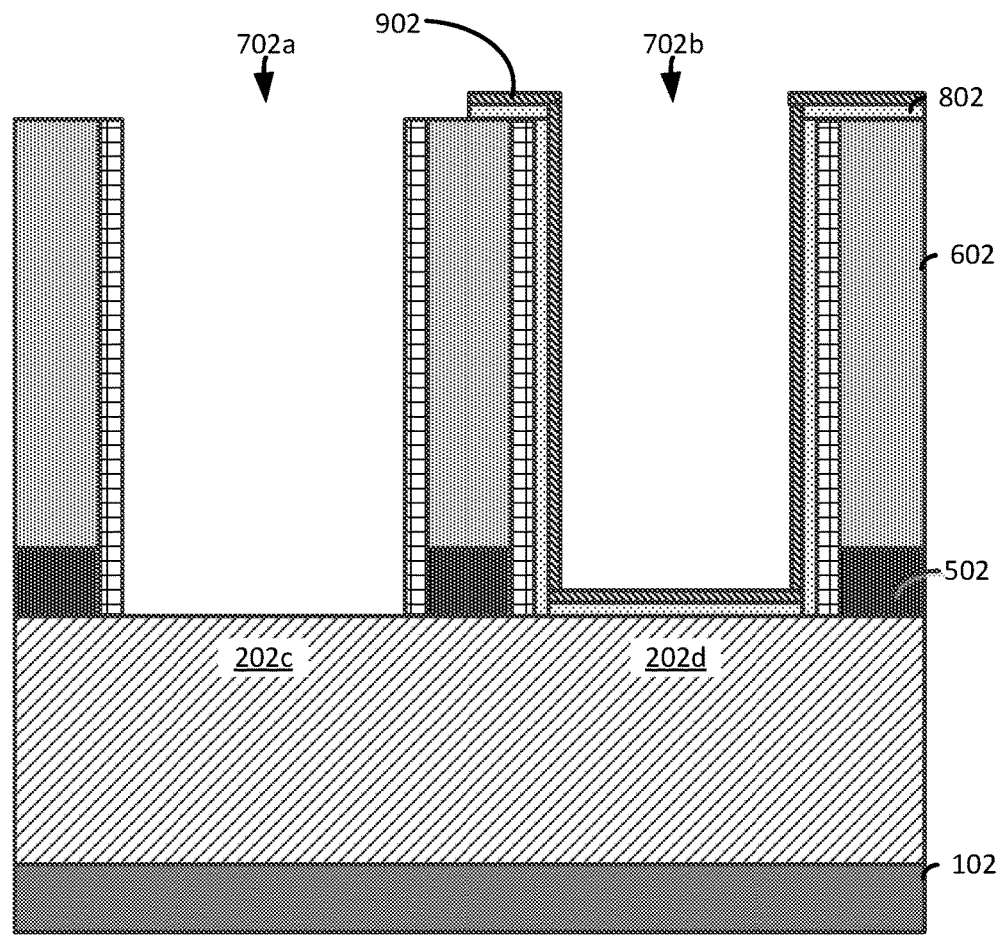

FIG. 13A and FIG. 13B illustrate cut-away views following the removal of the mask 1202 (of FIGS. 12A and 12B) and the patterning of the mask 1302 over the channel region 202a. Once the mask 1302 is formed, a selective etching process is performed to remove the exposed portions of the first metal layer 802 from the channel regions 202b and 202c. The etching process removes the exposed portions of the barrier metal layer 1102 and the sacrificial patterning layer 904 to expose the sacrificial block layer 902 in the channel region 202d.

Figure 14A:
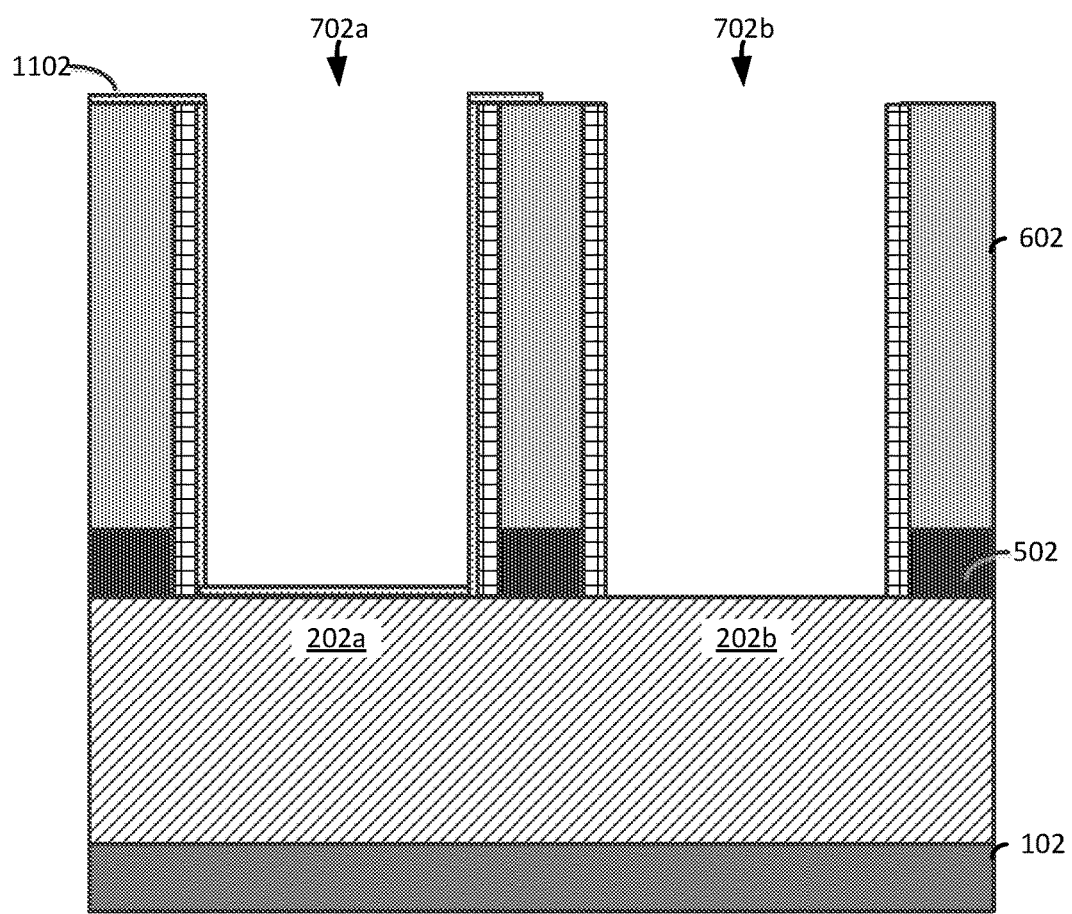
FIG. 14A and FIG. 14B illustrate cut-away views following the removal of the mask.
Figure 14B:
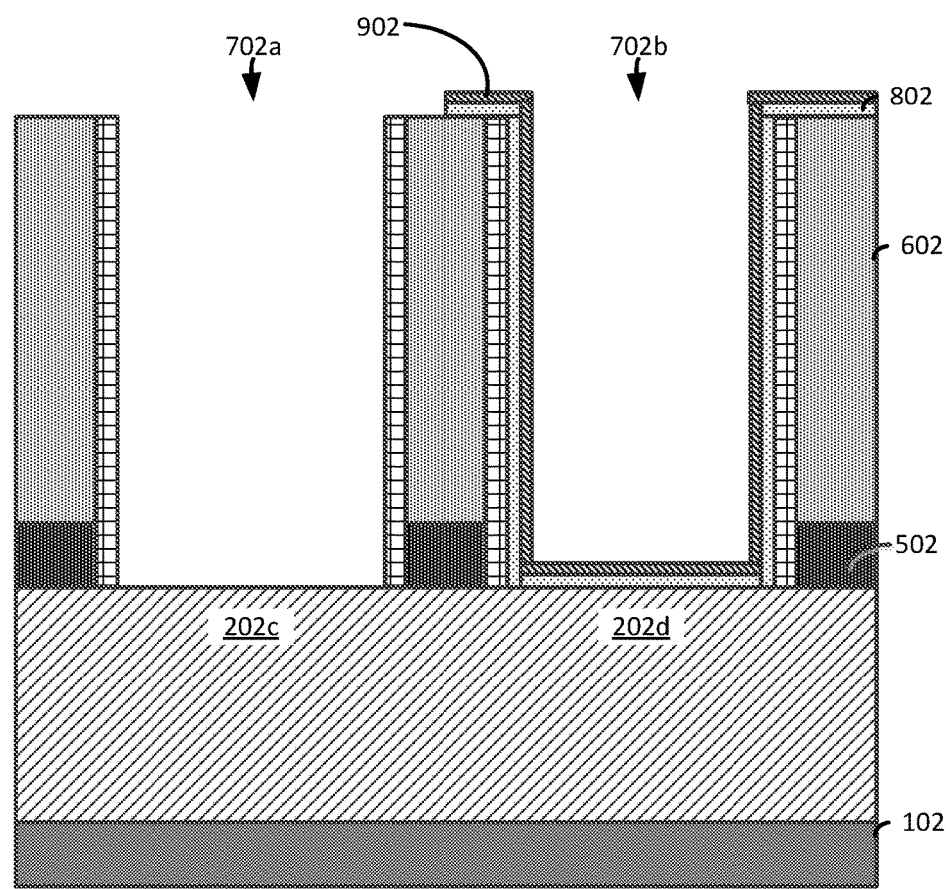
Figure 15A:
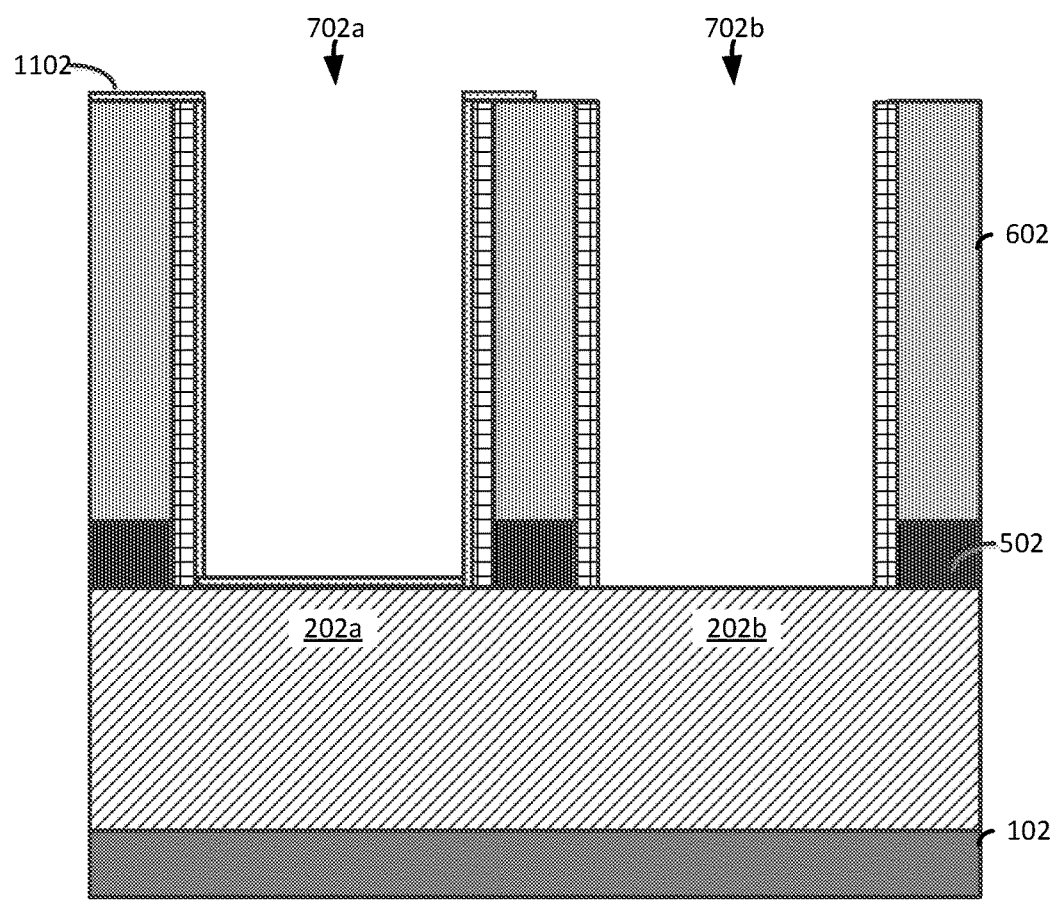
FIG. 15A and FIG. 15B illustrate cut-away views following the removal of exposed portions of the sacrificial block layer (of FIG. 14B) from the channel region using a selective etching process.
Figure 15B:
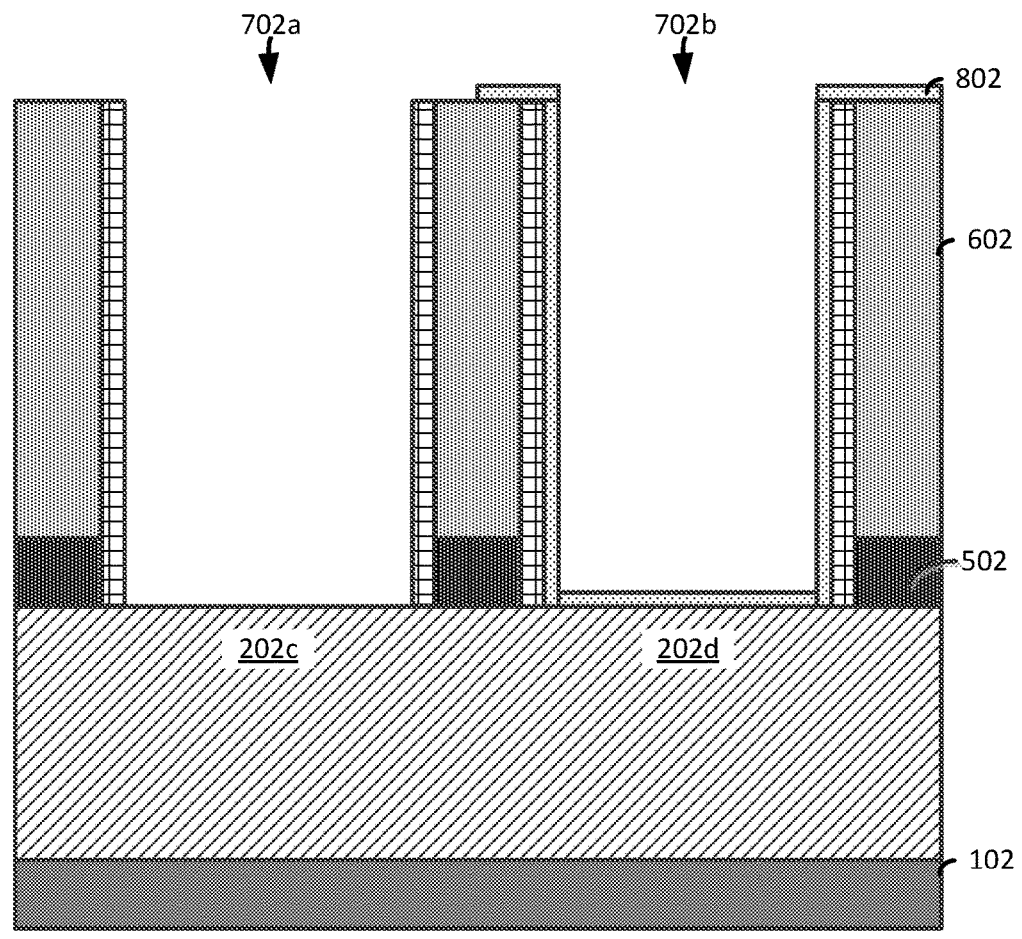

FIG. 14A and FIG. 14B illustrate cut-away views following the removal of the mask 1302. FIG. 15A and FIG. 15B illustrate cut-away views following the removal of exposed portions of the sacrificial block layer 902 (of FIG. 14B) from the channel region 202d using a selective etching process.

Figure 16A:
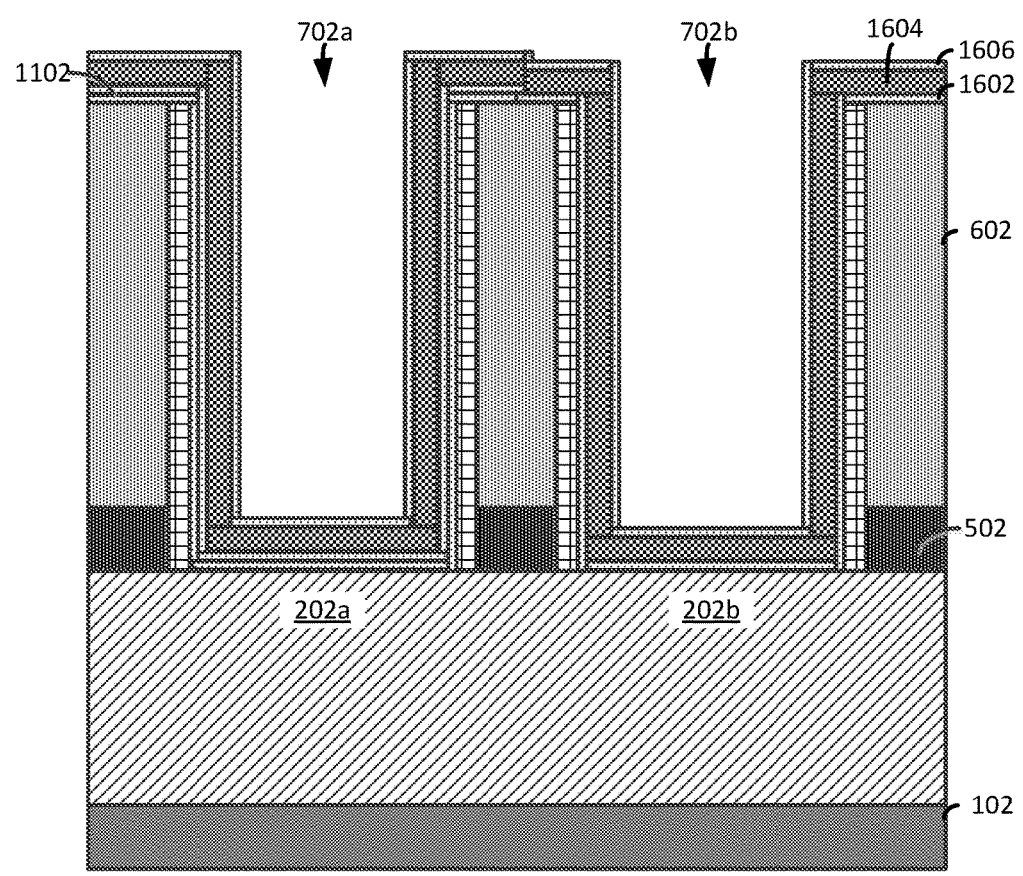
FIG. 16A and FIG. 16B illustrate cut-away views following the deposition of a third metal layer in the channel regions.
Figure 16B:
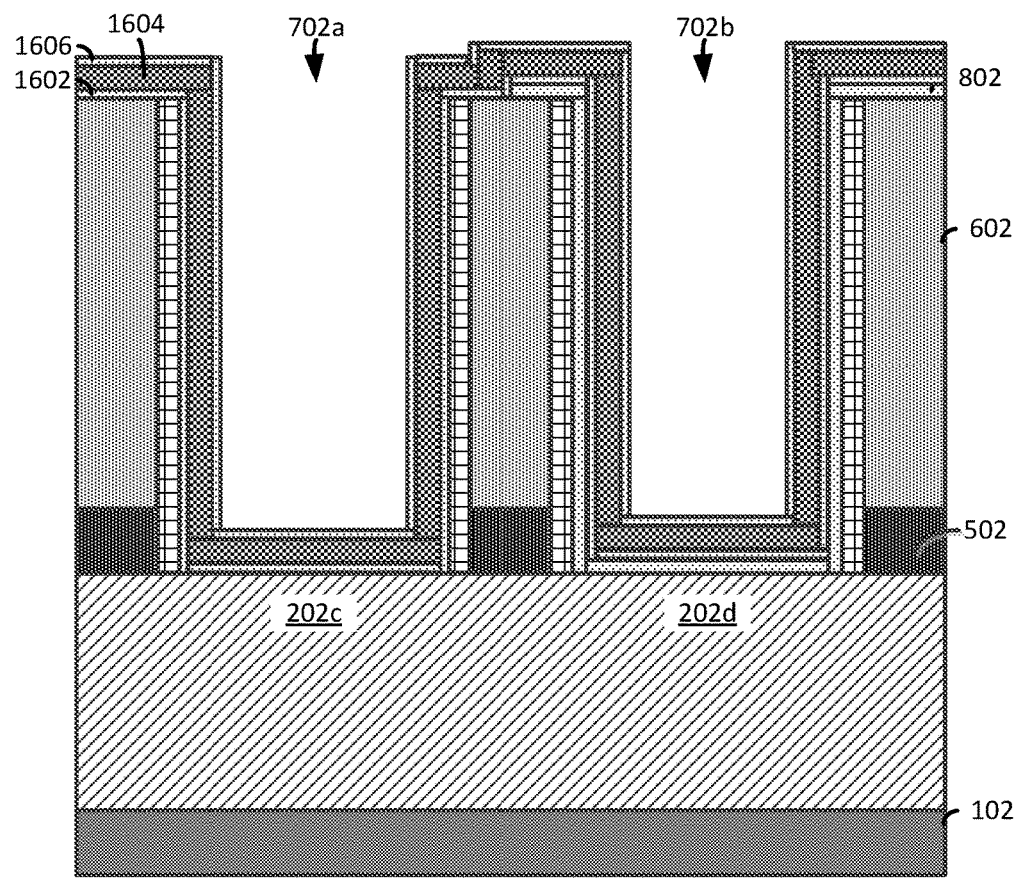

FIG. 16A and FIG. 16B illustrate cut-away views following the deposition of a third metal layer 1602 in the channel regions 202a, 202b, 202c, and 202d. Following the deposition of the third metal layer 1602, a NFET work function metal layer 1604 is deposited on the third metal layer 1602 and a fourth metal layer 1606 is deposited on the NFET work function metal layer 1604 in the channel regions 202a, 202b, 202c, and 202d. The third metal layer 1602 or the fourth metal layer 1606 are optional in some exemplary embodiments. The nFET work function metal could be TiAl, Al, Ti, TiAlC, TaAlC, and any combination thereof. In one embodiment, the third metal layer 1602 is TiN. In another embodiment, the fourth metal layer 1606 is TiN. The third metal layer 1602 is from 1 angstrom to 25 angstrom. And the fourth metal layer 1606 is from 1 angstrom to 25 angstrom. In one embodiment, the fourth metal layer 1606 is optional. The nFET work function metal thickness is from 10 angstrom to 100 angstrom.

Figure 17A:
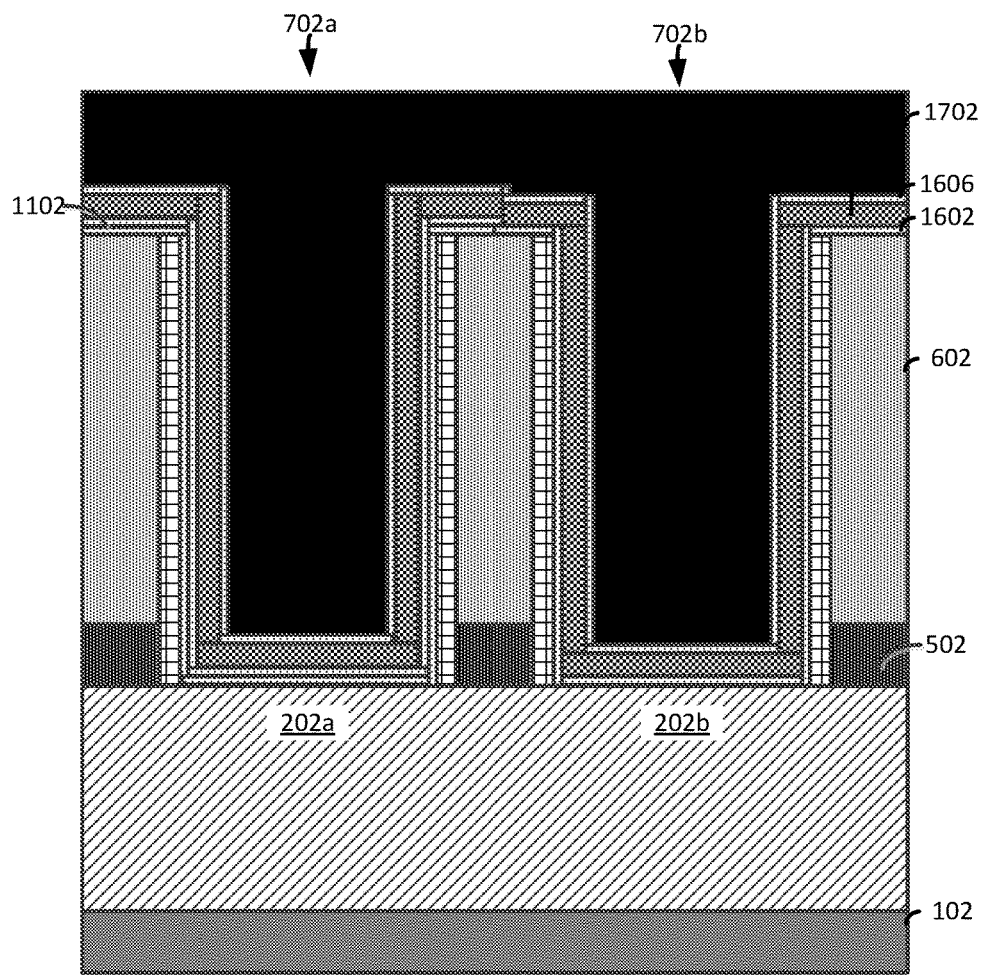
FIG. 17A and FIG. 17B illustrate cut-away views following the patterning of a mask over the channel regions and an etching process that removes the fourth metal layer, the NFET work function metal layer, and the third metal layer.
Figure 17B:
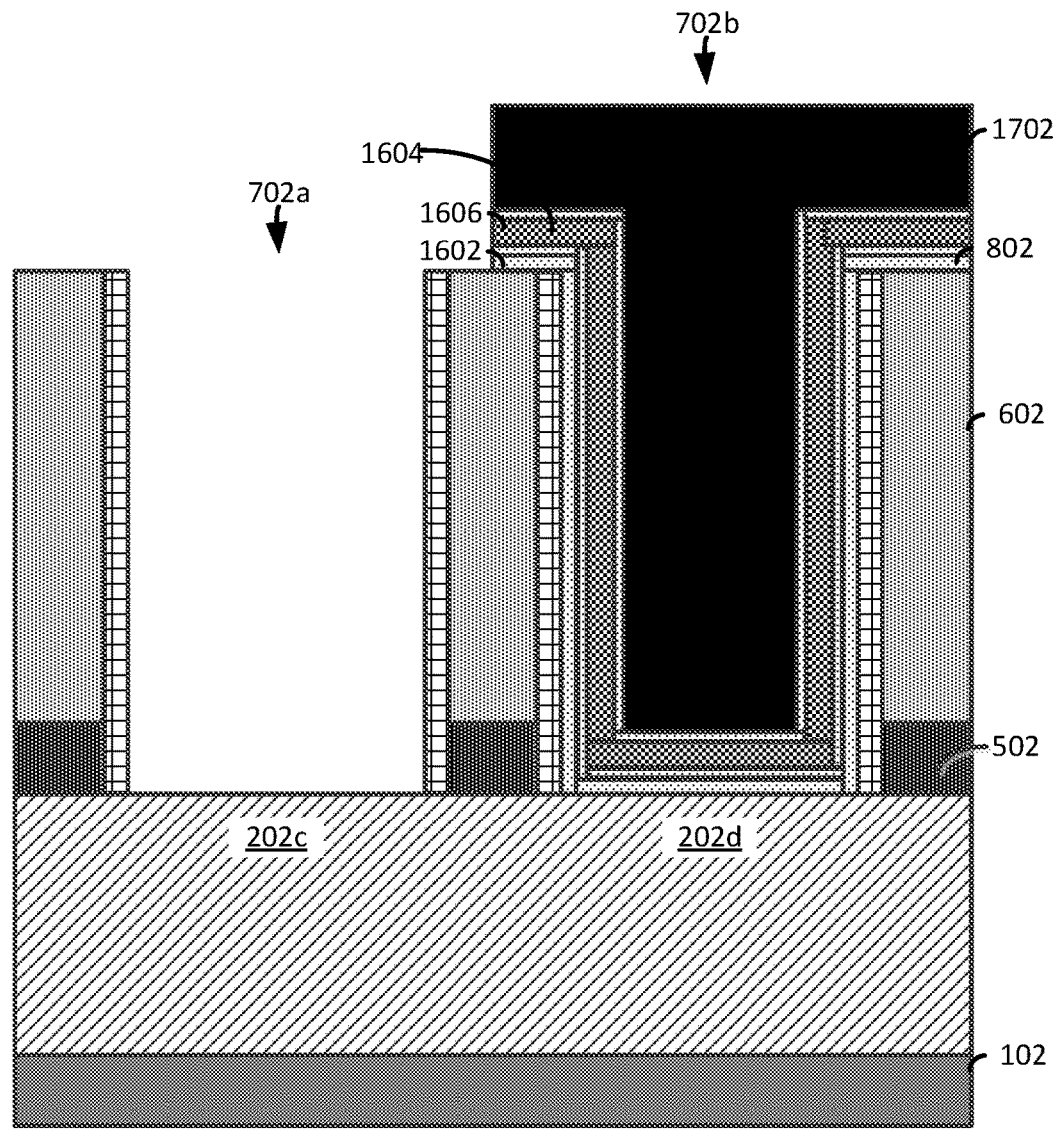

FIG. 17A and FIG. 17B illustrate cut-away views following the patterning of a mask 1702 over the channel regions 202a, 202b, and 202d and an etching process that removes the fourth metal layer 1606, the NFET work function metal layer 1604, and the third metal layer 1602 to expose the channel region 202c.

Figure 18A:
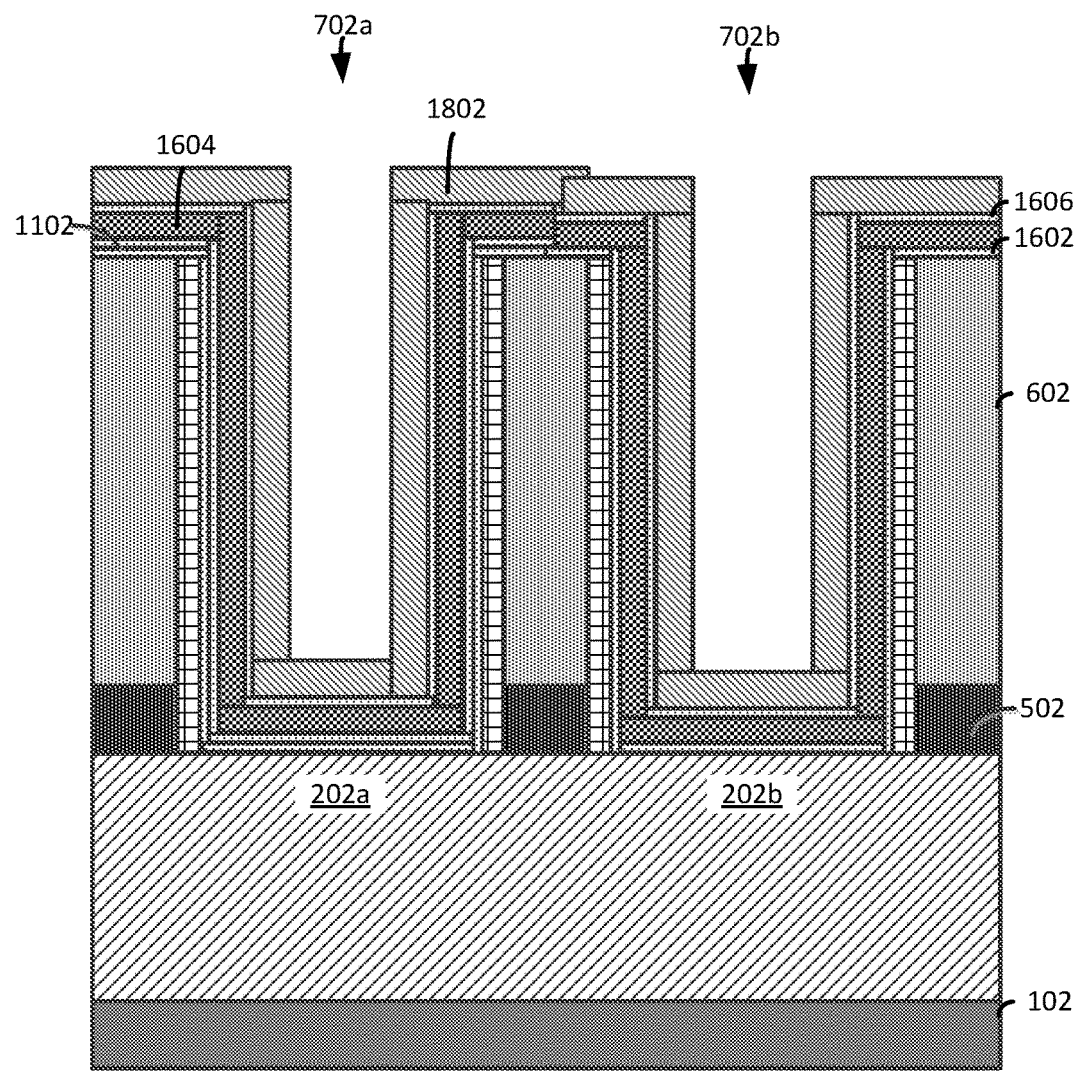
FIG. 18A and FIG. 18B illustrate cut-away views following the removal of the mask (of FIGS. 17A and 17B) and the deposition of a work function metal on the channel regions.
Figure 18B:
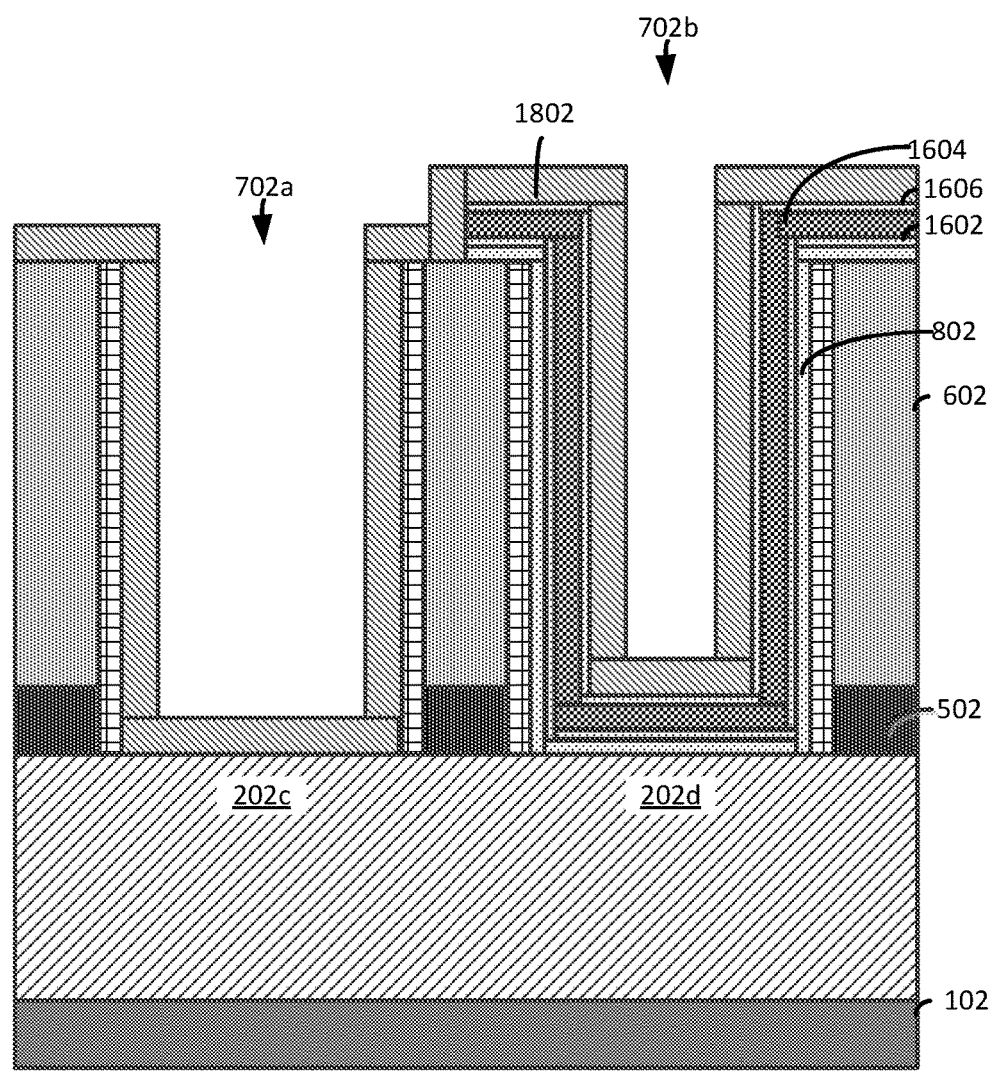

FIG. 18A and FIG. 18B illustrate cut-away views following the removal of the mask 1702 (of FIGS. 17A and 17B) and the deposition of a work function metal 1802 on the channel regions 202a, 202b, 202c, and 202d.

The type of work function metal(s) 1802 depends on the type of transistor and can differ between the nFET and pFET devices. Non-limiting examples of suitable work function metals 1802 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering. In one embodiment, the work function metal 1802 is TiN.

Figure 19A:
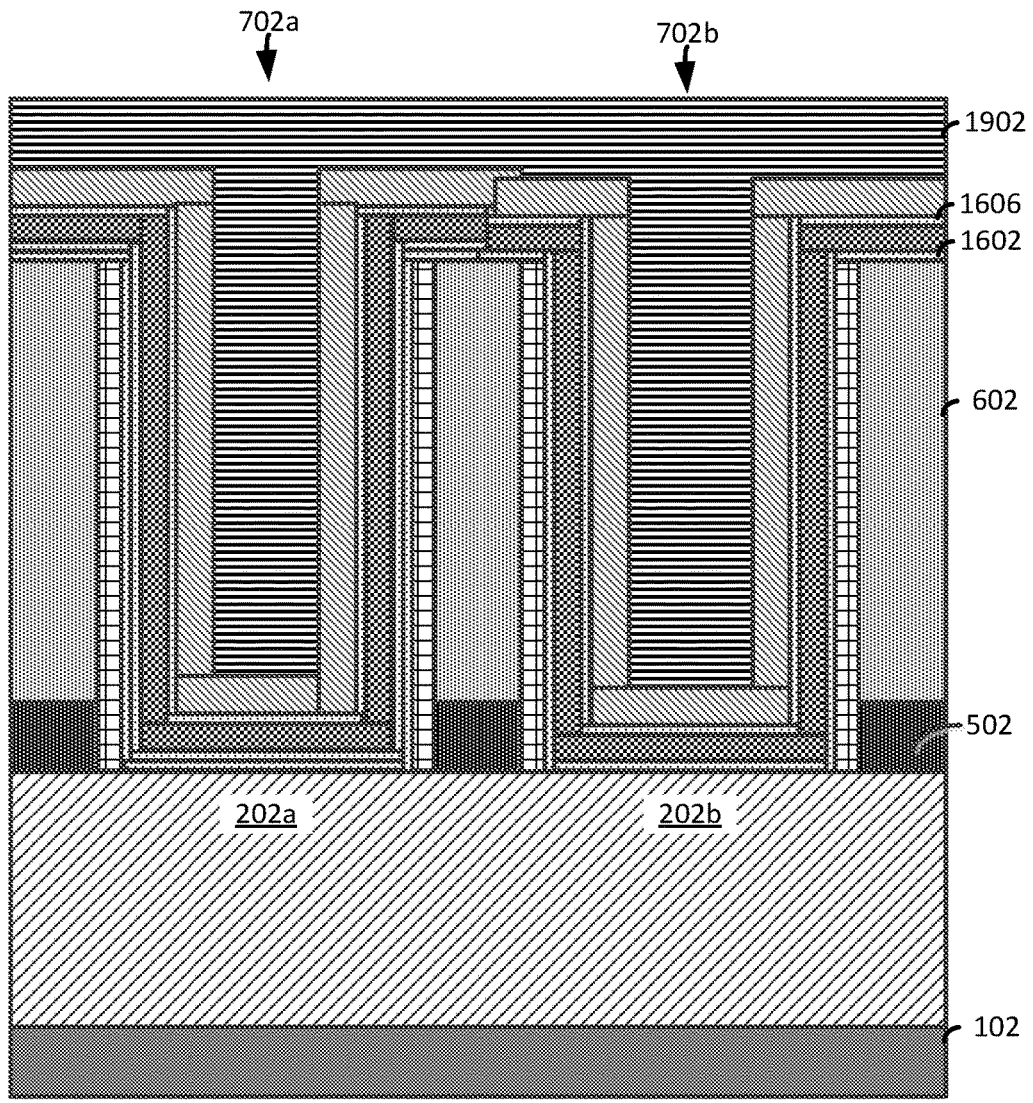
FIG. 19A and FIG. 19B illustrate cut-away views following the deposition of gate conductor materials that are deposited in the trenches.
Figure 19B:
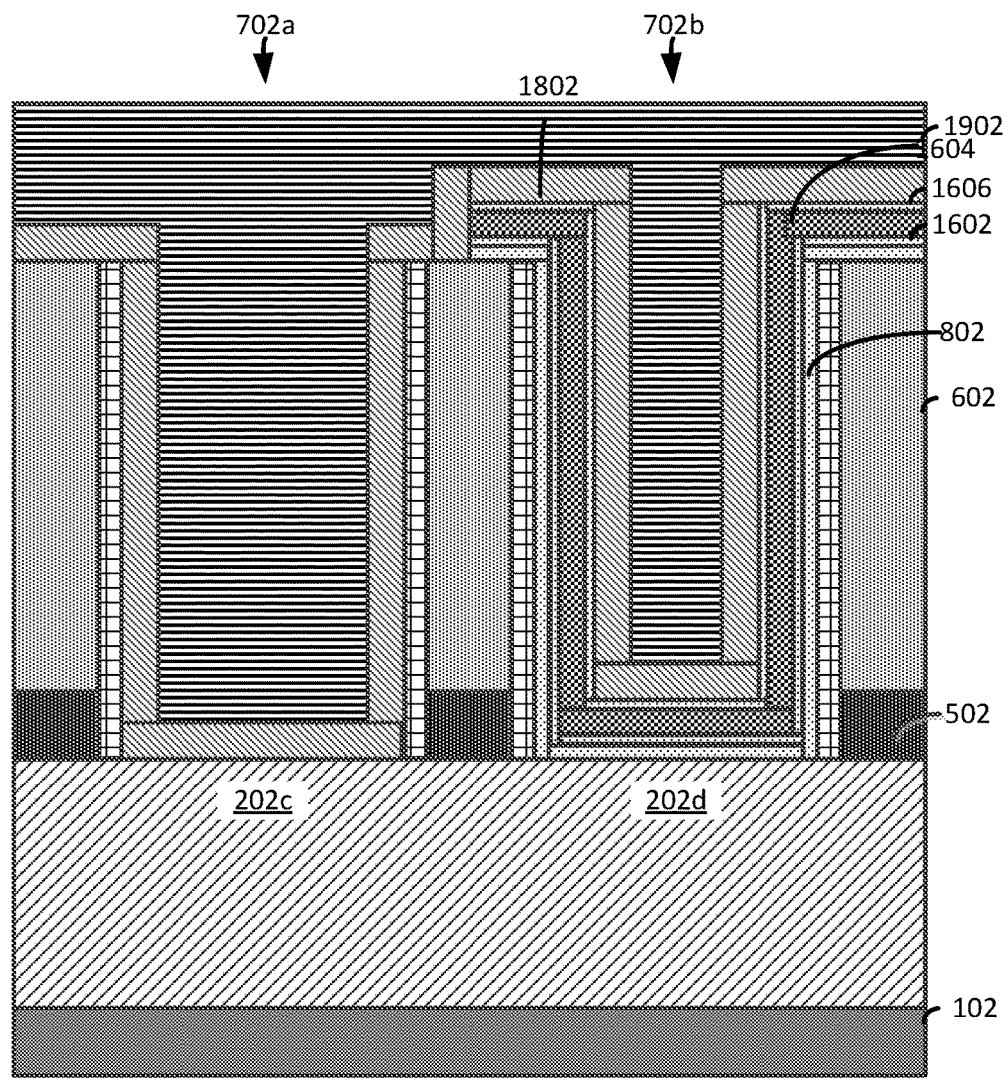

FIG. 19A and FIG. 19B illustrate cut-away views following the deposition of gate conductor 1902 materials that are deposited in the trenches 702a and 702b. The gate conductor 1902 material(s) is deposited over the gate dielectric materials and work function metal(s). Non-limiting examples of suitable conductive metals include aluminum (Al), platinum (Pt), gold (Au), tungsten (W), titanium (Ti), or any combination thereof. The gate conductor 1902 material(s) can be deposited by a suitable deposition process, for example, CVD, PECVD, PVD, plating, thermal or e-beam evaporation, and sputtering.

Figure 20A:
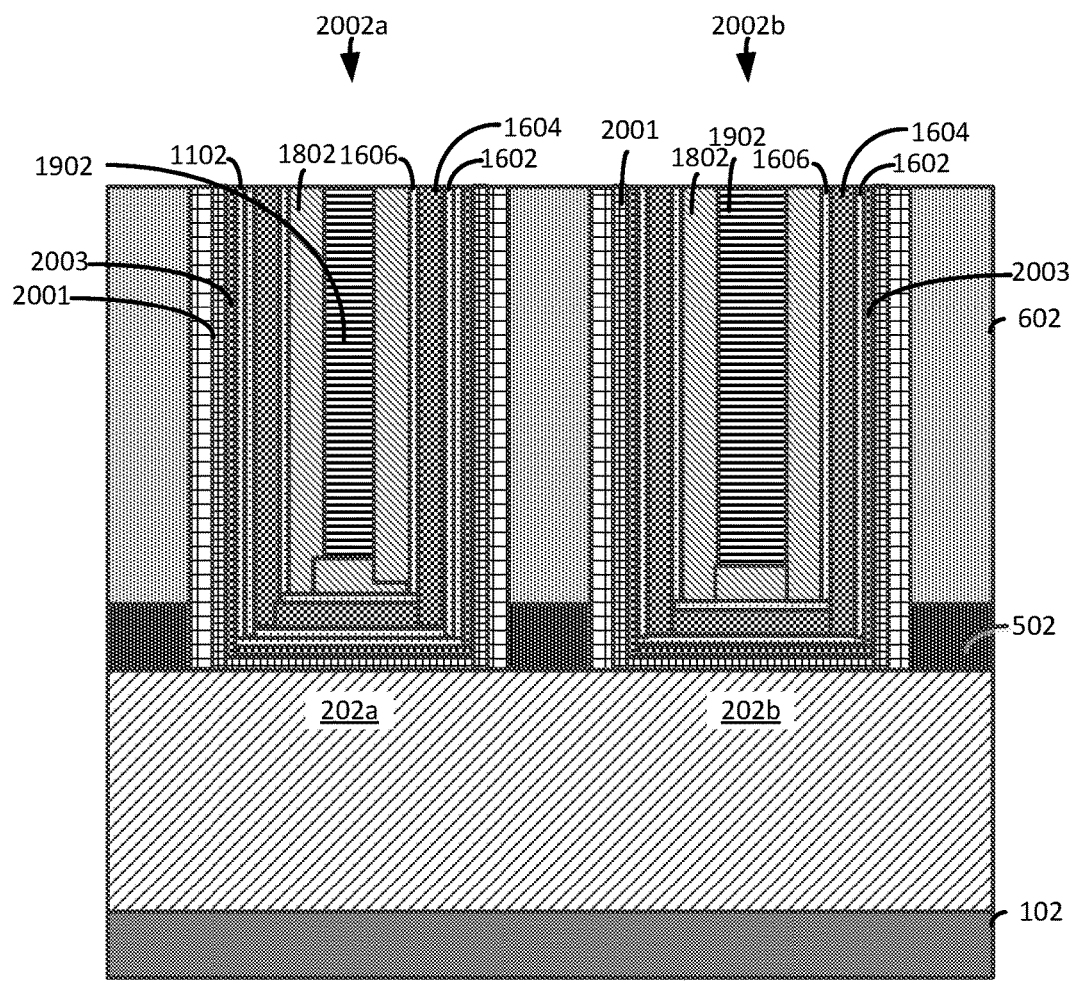
Figure 20B:
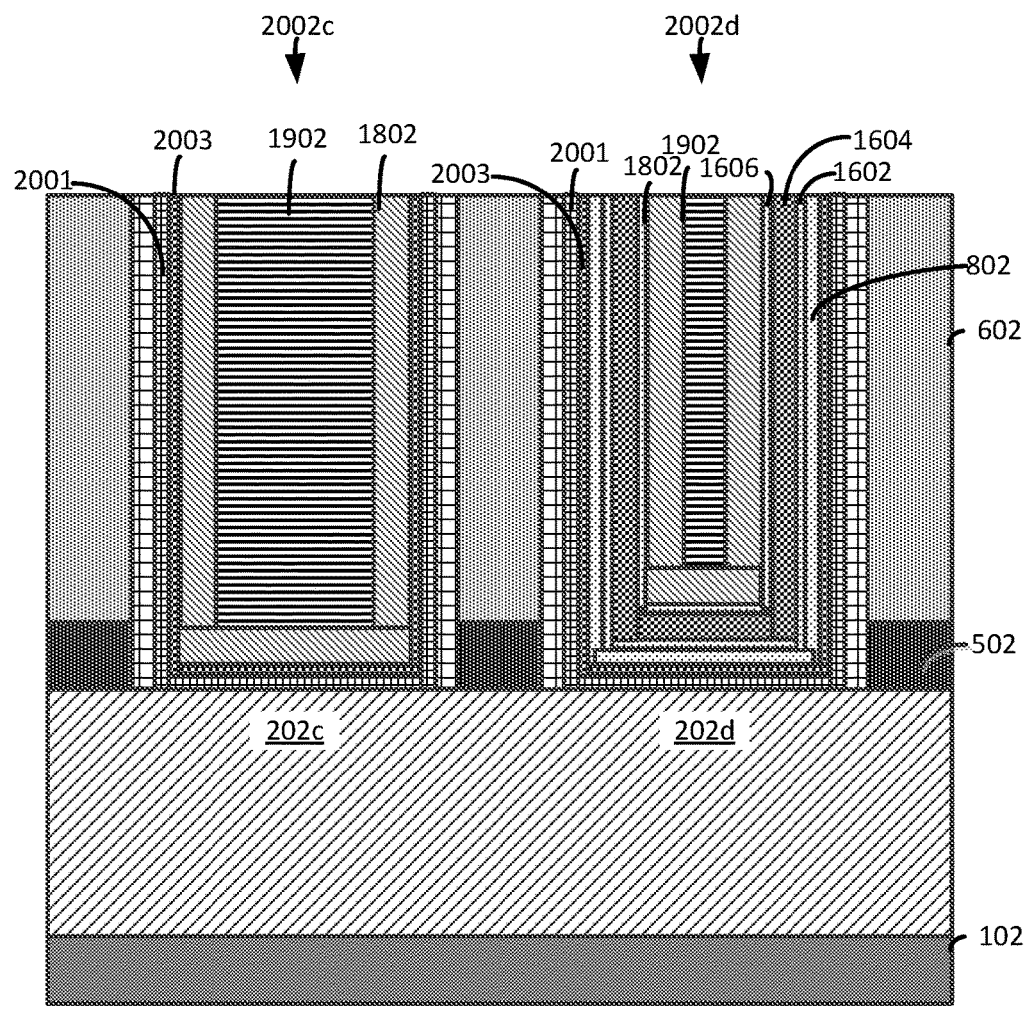

FIG. 20A and FIG. 20B illustrate cut-away views following a planarization process such as, for example, chemical mechanical polishing (CMP), which is performed to remove the overburden of the deposited gate materials and form the gate stacks 2002a, 2002b 2002c and 2002d over the channel regions 202a, 202b, 202c, and 202d respectively.

Each of the gate stacks 2002a, 2002b 2002c and 2002d have different material arrangements such that the voltage thresholds of the gate stacks 2002a, 2002b 2002c and 2002d are different and the type of resultant devices are different. In the illustrated exemplary embodiment, the gate stack 2002a is an n-type gate stack with a relatively higher threshold voltage than the gate stack 2002b, that is an n-type gate stack with a relatively lower threshold voltage. The gate stack 2002d is a p-type gate stack with a relatively higher threshold voltage than the threshold voltage of the p-type gate stack 2002c.

The gate stacks 2002a-d each have an interfacial layer 2001 and a high k dielectric layer 2003 that are formed prior to forming the first metal layer 802 (of FIG. 8A).

FIGS. 21-27 illustrate an exemplary method for forming a metal capping layer over the channel region 202c while not forming a metal capping layer over the channel region 202d. The method described in FIGS. 21-28 can be performed prior to forming the gates 202a-d described above. The metal capping layer can be selectively formed under any or all of the gates 202a-d, which can be used to further change the threshold voltage of the gates a-d. In other words, the metal capping layer can be formed in a channel region of a device prior to forming a gate stack to further tune the threshold voltage of a particular device.

Figure 21:
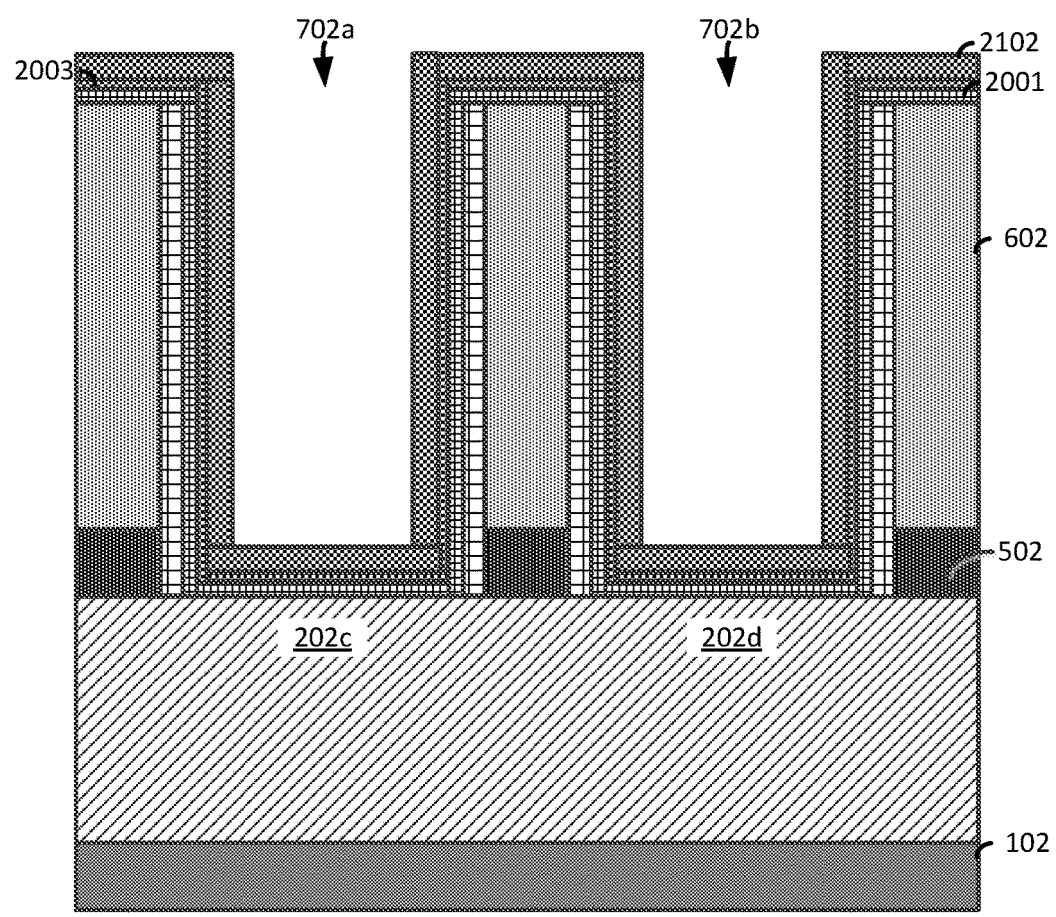
FIGS. 21-27 illustrate an exemplary method for selectively forming a metal capping layer over the channel regions.

In this regard, FIG. 21 illustrates a cut-away view following the removal of the sacrificial gates 302 (as shown in FIGS. 7A and 7B) to form the cavities 702a and 702b. FIG. 21 shows the resultant structure following the deposition of an interfacial layer 2001, which can be used when forming the metal capping layer or prior to forming gate stacks 2002a-d described above. The interfacial layer can include, for example, $SiO_2$ or SiON. Following the formation of the interfacial layer 2001, a high k dielectric layer 2003 is formed on the interfacial layer 2001. A metal capping barrier layer 2102 is deposited on the high k dielectric layer 2003. The metal capping barrier layer 2102 can include, for example, TiN or other metal layers.

Figure 22:
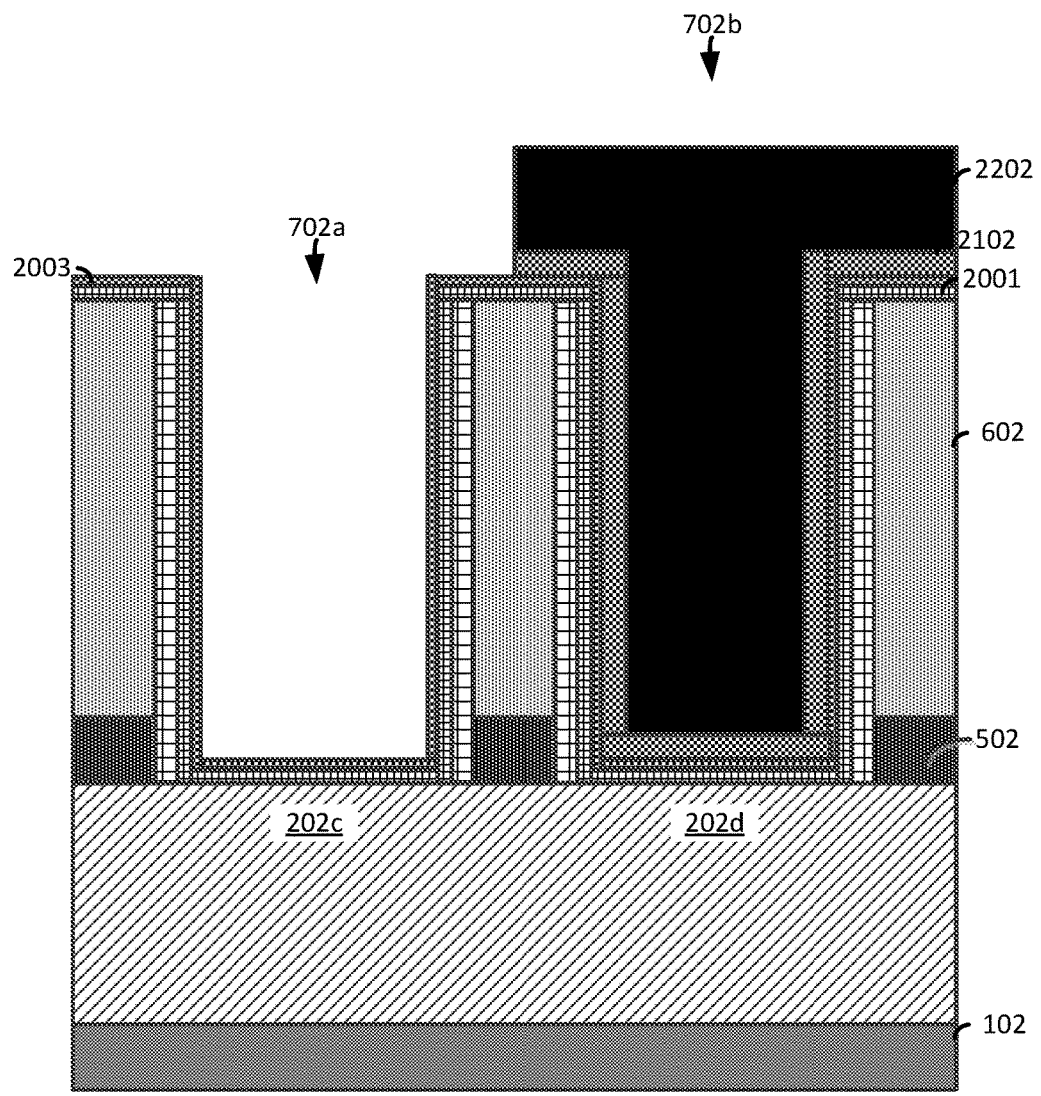

FIG. 22 illustrates a cut-away view following the patterning of a mask 2202 over the channel region 202d and the removal of the exposed metal capping barrier layer 2104 using a suitable selective etching process such as, for example, reactive ion etching.

Figure 23:
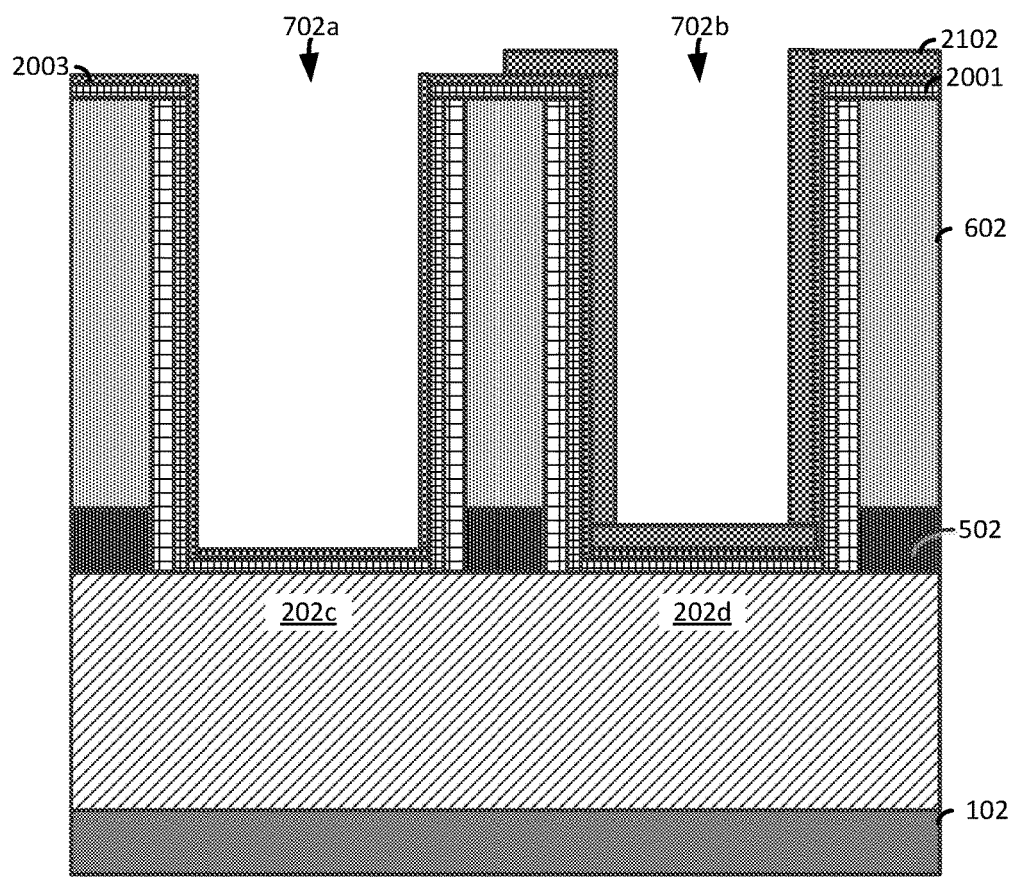

FIG. 23 illustrates a cut-away view following the removal of the mask 2202.

Figure 24:
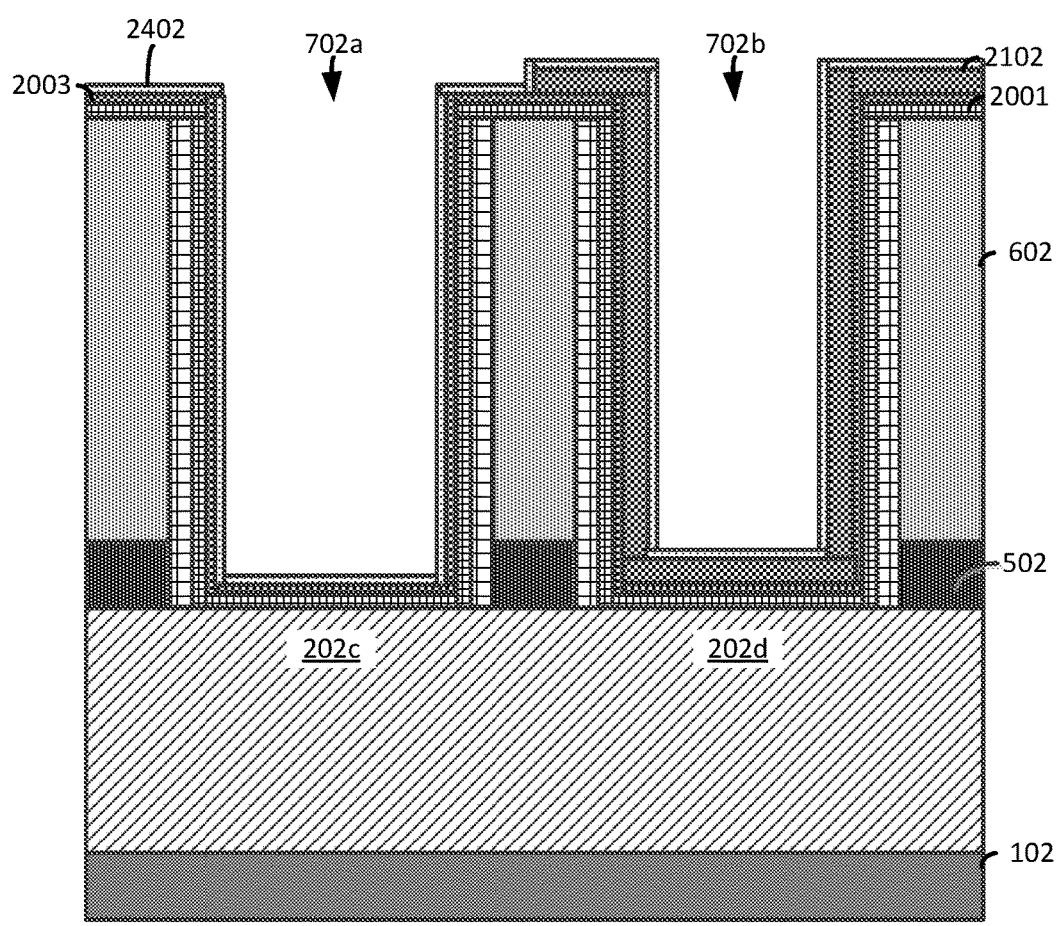

FIG. 24 illustrates a cut-away view following the deposition of a metal capping layer 2402 over the channel regions 202c and 202d.

Figure 25:
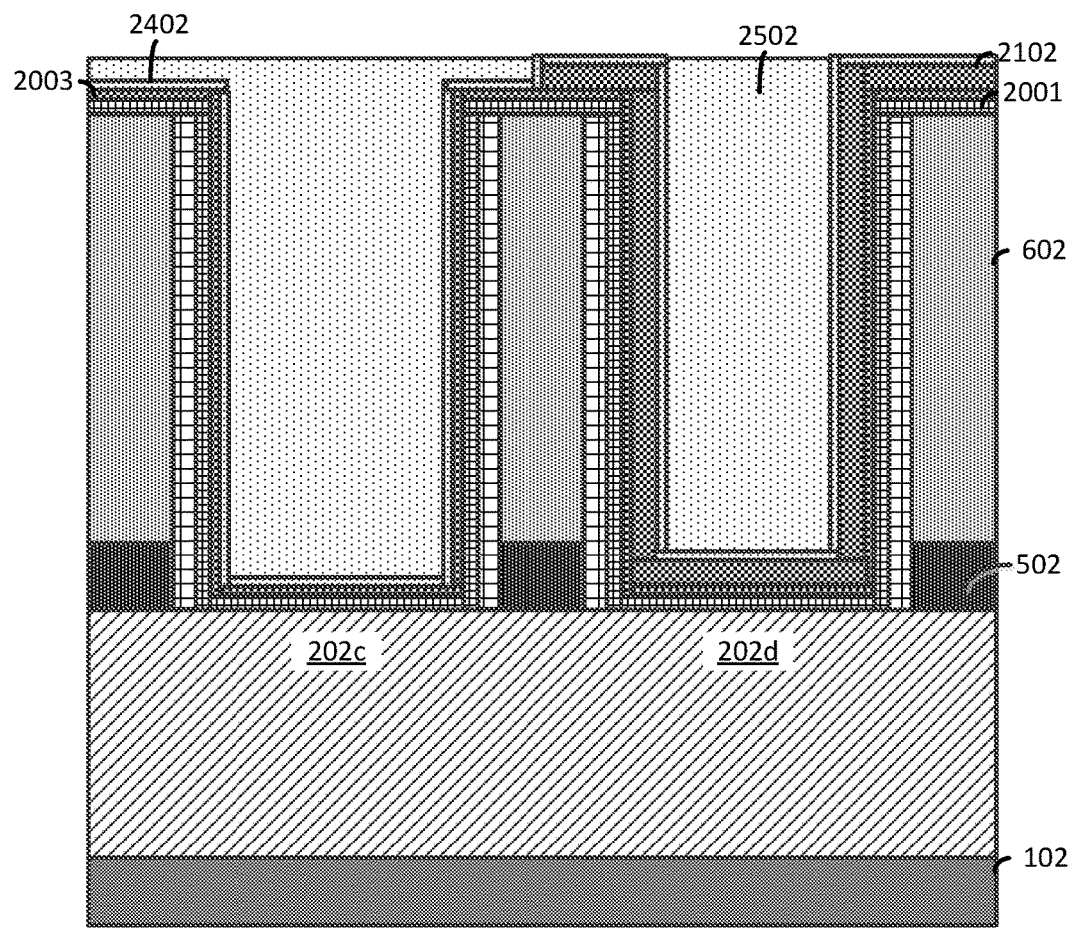

FIG. 25 illustrates a cut-away view following the deposition of a layer of a semiconductor material 2502 such as, for example, amorphous silicon in the trenches 702a and 702b.

Figure 26:
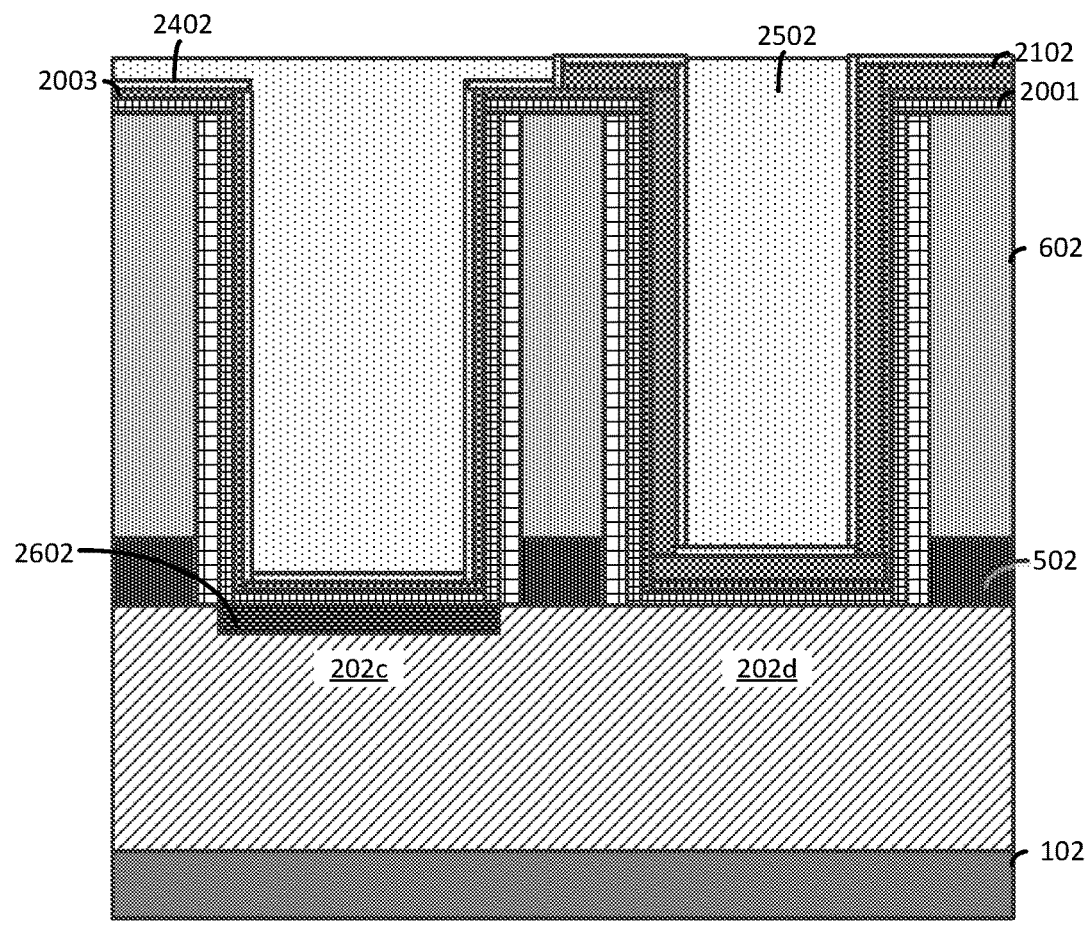

FIG. 26 illustrates a cut-away view following an annealing process that forms the metal capping layer region 2602 in the channel region 202c. The annealing process heats the wafer and causes dopants to move from the metal capping layer 2402 into the semiconductor material of the channel region 202c to form the metal capping layer region 2602. One metal layer (not shown here) may be deposited on top of the metal capping layer.

Figure 27:
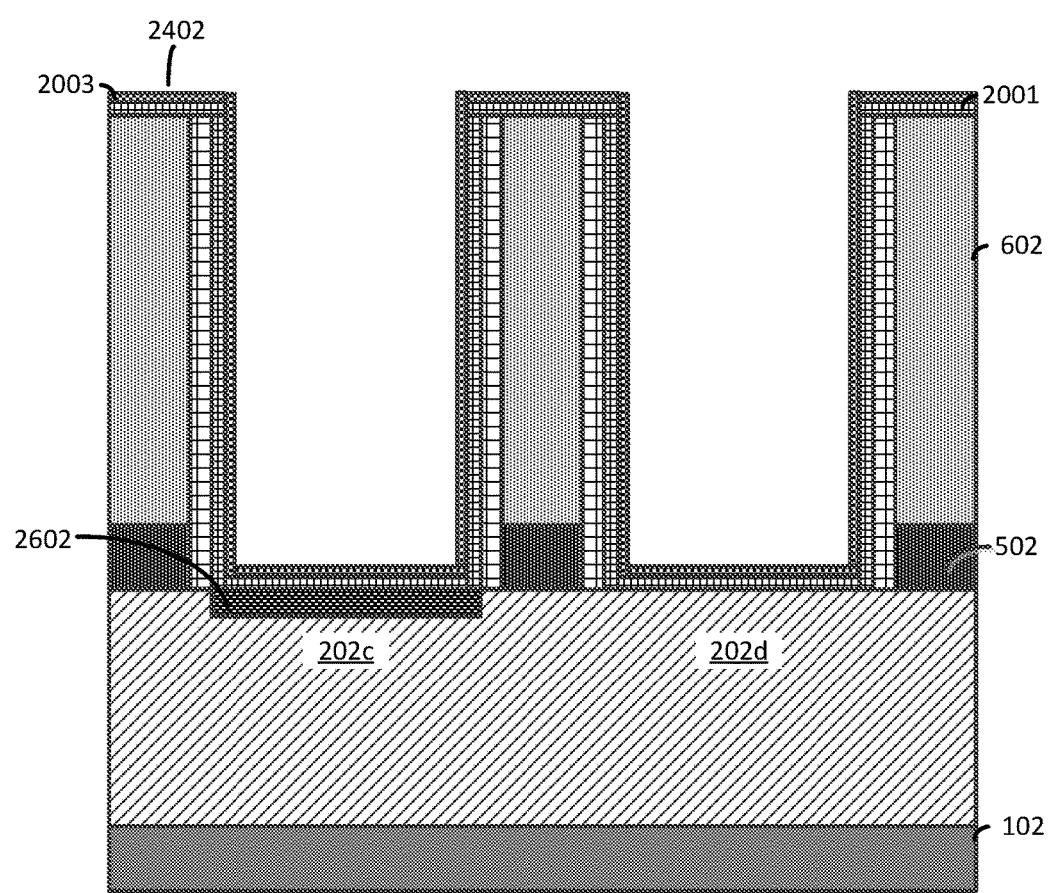

FIG. 27 illustrates a cut-away view following the removal of the semiconductor material 2502, the metal capping layer 2402, and the metal capping barrier layer 2102 in the cavities 702a and 702b. The channel region 202c includes the metal capping layer region 2602 while the channel region 202d does not include a metal capping layer region 2602.

The method described in FIGS. 21-27 provides for selectively forming a metal capping layer 2602 on a channel region of a device prior to forming the gate stacks 2002a-d. Using the method in FIGS. 21-27 any of the gate stacks 2002a-d can have a metal capping layer 2602 arranged in the underlying channel regions 202a-d if desired.

Figure 28A:
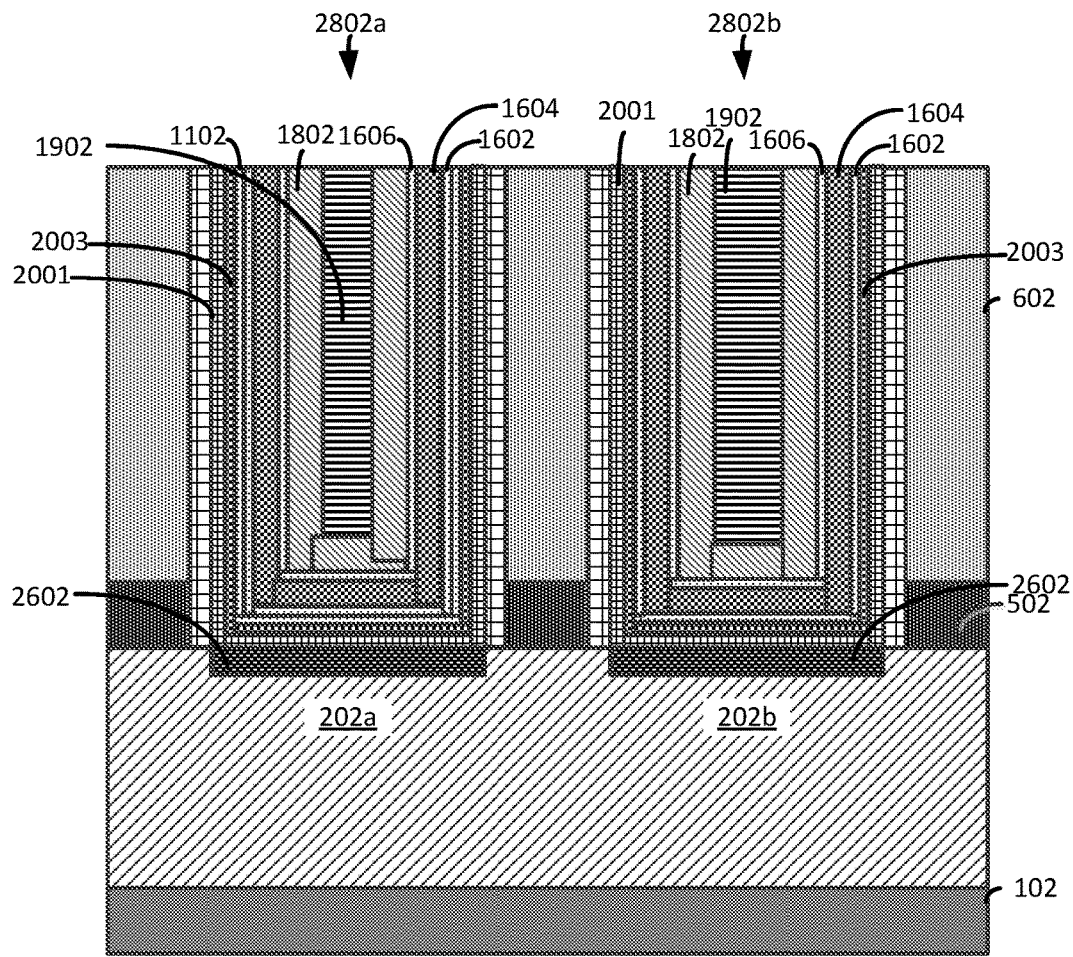
FIG. 28A and FIG. 28B illustrate cut-away views of resultant gate stacks.
Figure 28B:
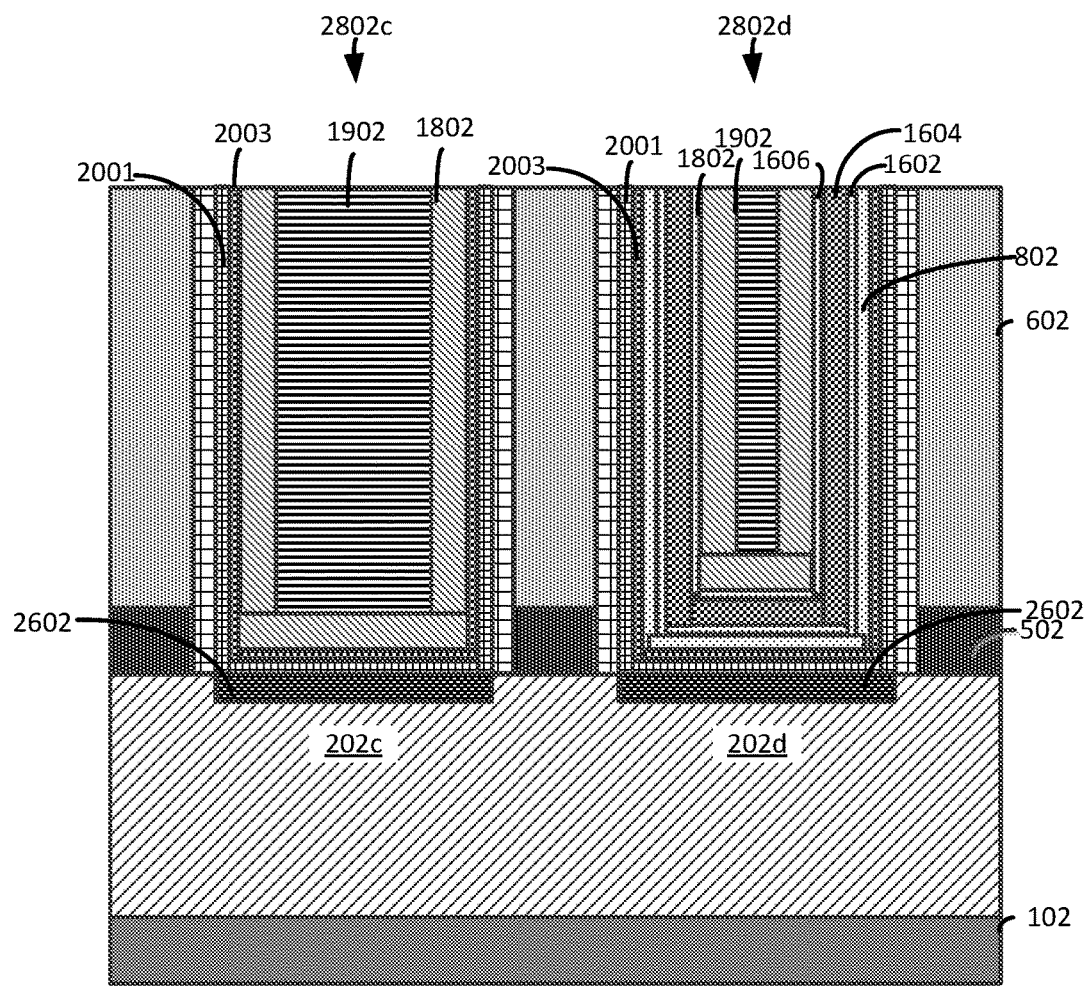

FIG. 28A and FIG. 28B illustrate cut-away views of gate stacks 2802a 2802b, 2802c, and 2802d, which are similar to the gate stacks 2002a, 2002b, 2002c and 2002d respectively, however each of the gate stacks 2802a-d include a metal capping layer 2602 arranged in the channel regions 202a-d respectively.

Figure 29:
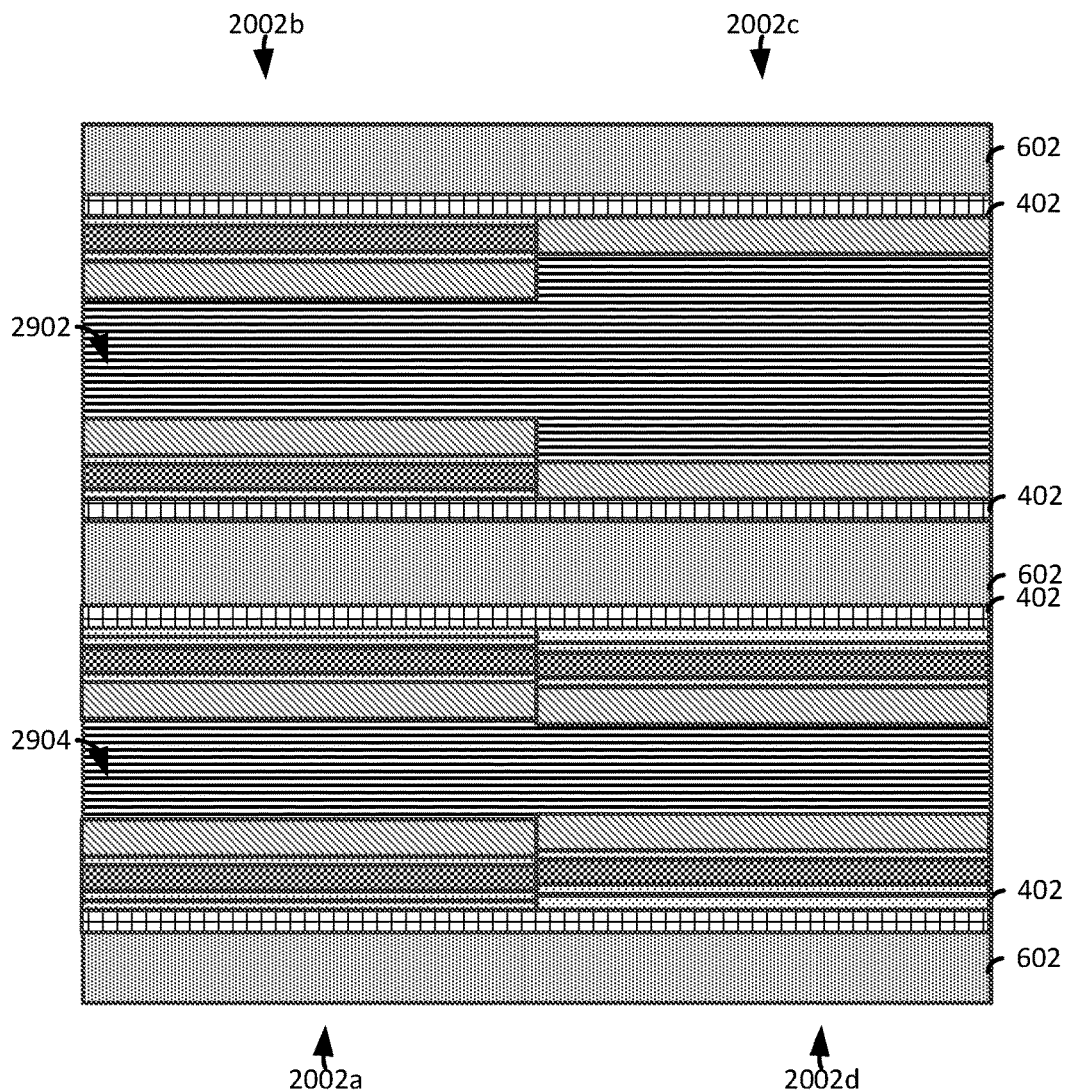
FIG. 29 illustrates a top view of exemplary embodiments of FET devices.

FIG. 29 illustrates a top view of exemplary embodiments of FET devices that can be formed using the methods described above. In this regard, the device 2902 includes a gate stack 2002b arranged adjacent to a gate stack 2002c. The device 2904 includes a gate stack 2002a arranged adjacent to a gate stack 2002d.

Figure 30:
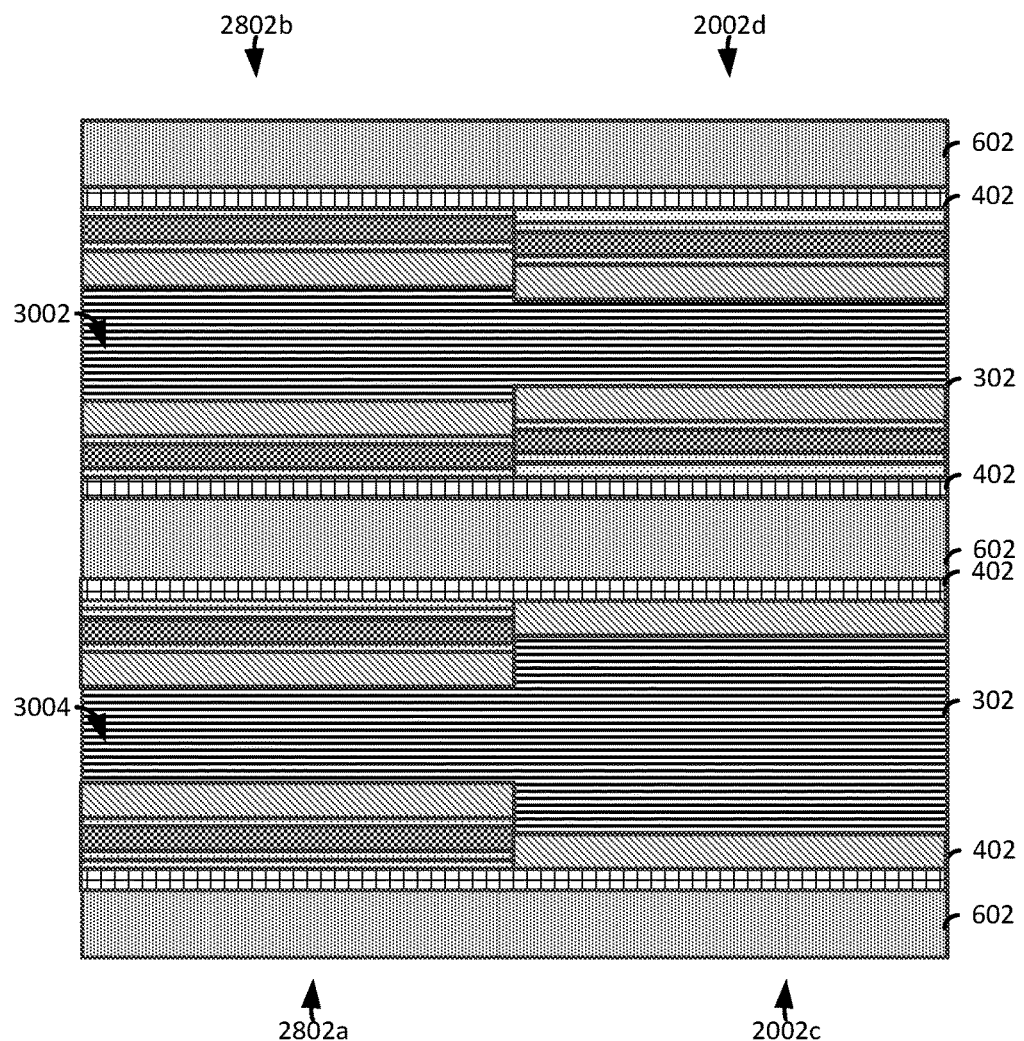
FIG. 30 illustrates a top view of exemplary embodiments of FET devices.

FIG. 30 illustrates a top view of exemplary embodiments of FET devices that can be formed using the methods described above. In this regard, the device 3002 includes a gate stack 2802b arranged adjacent to a gate stack 2002d. The device 3004 includes a gate stack 2802a arranged adjacent to a gate stack 2002c.

Figure 31:
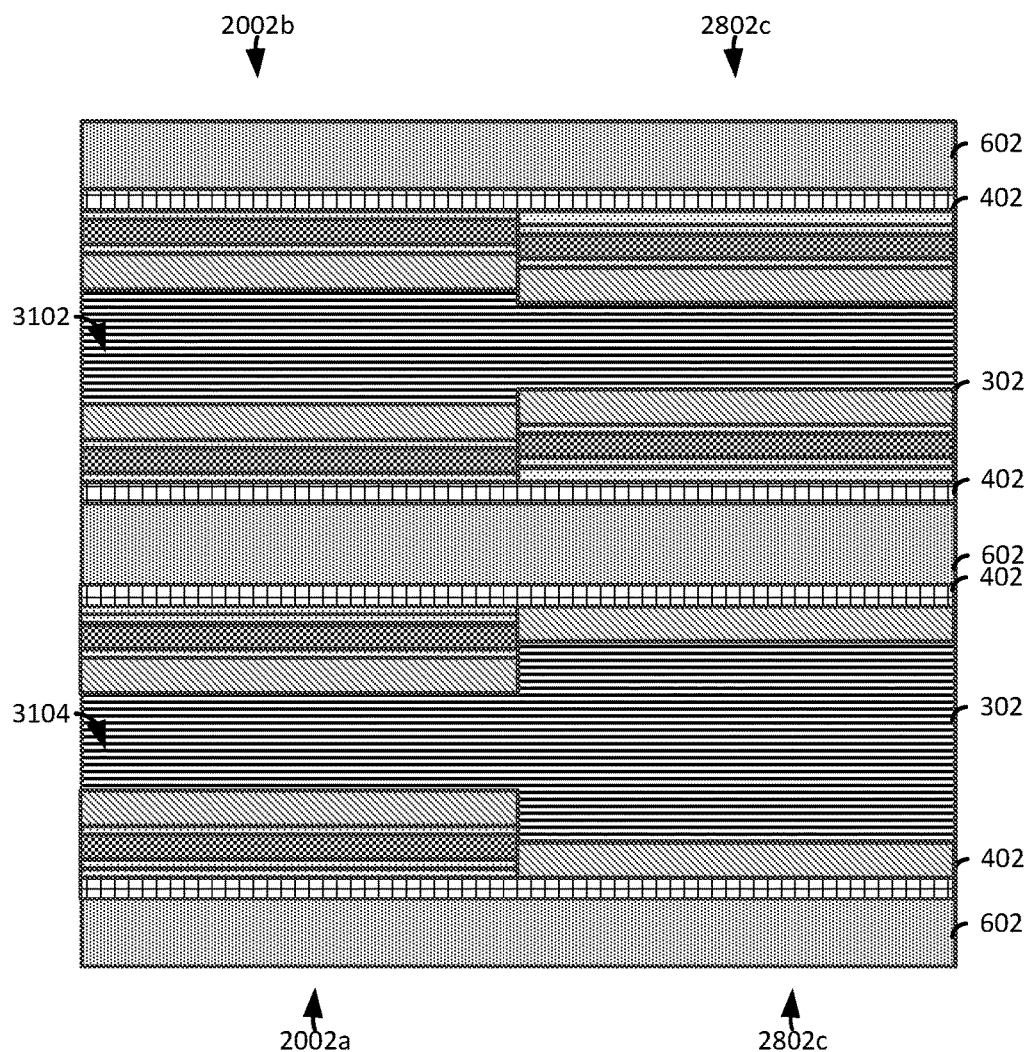
FIG. 31 illustrates a top view of exemplary embodiments of FET devices.

FIG. 31 illustrates a top view of exemplary embodiments of FET devices that can be formed using the methods described above. In this regard, the device 3102 includes a gate stack 2002b arranged adjacent to a gate stack 2802c. The device 3104 includes a gate stack 2002a arranged adjacent to a gate stack 2802c.

After the gate stacks are formed, additional insulating material (not shown) can be deposited over the device(s). The insulating material can be patterned to form cavities (not shown) that expose portions of the source/drain region 502 and the gate stacks. The cavities can be filled by a conductive material (not shown) and, in some embodiments, a liner layer (not shown) to form conductive contacts (not shown).

The methods and resultant structures described herein provide for forming gate stacks having different layers and different threshold voltages on the same substrate or wafer. The different threshold voltages allow the overall performance of the designed integrated circuit to be improved while reducing the scale of the semiconductor devices.

As used herein, the terms "invention" or "present invention" are non-limiting terms and not intended to refer to any single aspect of the particular invention but encompass all possible aspects as described in the specification and the claims. The term "on" can refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming semiconductor devices, the method comprising:
   forming a first channel region, a second channel region, a third channel region, and a fourth channel region on a substrate;
   forming a first metal layer on the first channel region, the second channel region, the third channel region, and the fourth channel region;
   forming a sacrificial block layer on the first metal layer and forming a sacrificial patterning layer on the sacrificial block layer;
   removing the first metal layer, the sacrificial block layer and the sacrificial patterning layer from the first channel region;
   forming a barrier metal layer on the first channel region and over a nitride layer along with forming the harrier metal layer on the second channel region, the third channel region, and the fourth channel region;
   removing, from the second channel region and the third channel region, the first metal layer, the sacrificial block layer, the sacrificial patterning layer, and the barrier metal layer;
   removing, from the fourth channel region, the barrier metal layer, and the sacrificial patterning layer;
   removing the sacrificial block layer from the fourth channel region;
   depositing a third metal layer and a work function metal layer on the first channel region, the second channel region, the third channel region, and the fourth channel region;
   removing the third metal layer and the work function metal layer from the third channel region; and
   depositing another work function metal on the first channel region, the second channel region, the third channel region, and the fourth channel region.

2. The method of claim 1, wherein the first channel region, the second channel region, the third channel region, and the fourth channel region include semiconductor fins.

3. The method of claim 1, wherein prior to removing the first metal layer, the sacrificial block layer and the sacrificial patterning layer from the first channel region, a mask layer is patterned on the second channel region, the third channel region, and the fourth channel region.

4. The method of claim 1, further comprising depositing another nitride layer on the work function metal layer.

5. The method of claim 4, further comprising removing the another nitride layer from the third channel region when removing the third metal layer and the work function metal layer.

6. The method of claim 1, further comprising depositing a gate conductor material on the first channel region, the second channel region, the third channel region, and the fourth channel region.

7. The method of claim 1, further comprising forming an interfacial layer on the first channel region, the second channel region, the third channel region, and the fourth channel region prior to forming the first metal layer on the first channel region, the second channel region, the third channel region, and the fourth channel region.

8. The method of claim 1, further comprising forming a metal capping layer on the first channel region prior to forming the first metal layer on the first channel region.

9. The method of claim 1, further comprising forming a metal capping layer on the second channel region prior to forming the first metal layer on the second channel region.

10. The method of claim 1, further comprising forming a metal capping layer on the third channel region prior to forming the first metal layer on the third channel region.

11. The method of claim 1, further comprising forming a metal capping layer on the fourth channel region prior to forming the first metal layer on the first fourth region.

* * * * *